United States Patent
Ray et al.

(10) Patent No.: US 10,074,440 B2
(45) Date of Patent: Sep. 11, 2018

(54) ERASE FOR PARTIALLY PROGRAMMED BLOCKS IN NON-VOLATILE MEMORY

(71) Applicant: SanDisk Technologies LLC, Plano, TX (US)

(72) Inventors: Biswajit Ray, Mountain View, CA (US); Mohan Dunga, Santa Clara, CA (US); Changyuan Chen, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 6 days.

(21) Appl. No.: 15/337,522

(22) Filed: Oct. 28, 2016

(65) Prior Publication Data

US 2018/0122489 A1   May 3, 2018

(51) Int. Cl.
| | |
|---|---|
| *G11C 16/34* | (2006.01) |
| *G11C 16/10* | (2006.01) |
| *G11C 16/28* | (2006.01) |
| *G11C 16/04* | (2006.01) |
| *G11C 16/16* | (2006.01) |

(52) U.S. Cl.
CPC ...... *G11C 16/3431* (2013.01); *G11C 16/0483* (2013.01); *G11C 16/10* (2013.01); *G11C 16/16* (2013.01); *G11C 16/28* (2013.01); *G11C 16/3495* (2013.01)

(58) Field of Classification Search
CPC .................. G11C 16/3431; G11C 16/0483
USPC .................................................. 365/185.02
See application file for complete search history.

(56) References Cited

U.S. PATENT DOCUMENTS

| | | | |
|---|---|---|---|
| 6,285,599 | B1 * | 9/2001 | Shimada ............... G11C 16/16 365/185.22 |
| 6,426,898 | B1 | 7/2002 | Mihnea |
| 6,707,714 | B2 | 3/2004 | Kawamura |
| 7,009,889 | B2 | 3/2006 | Tran et al. |
| 7,403,424 | B2 | 7/2008 | Hemink et al. |
| 7,430,138 | B2 | 9/2008 | Higashitani |
| 7,450,433 | B2 | 11/2008 | Wan et al. |
| 7,457,166 | B2 | 11/2008 | Hemink et al. |
| 7,495,954 | B2 | 2/2009 | Ito |
| 7,804,718 | B2 | 9/2010 | Kim |
| 7,808,831 | B2 | 10/2010 | Mokhlesi et al. |
| 7,818,525 | B1 | 10/2010 | Frost et al. |
| 7,839,690 | B2 | 11/2010 | Lee et al. |
| 7,907,449 | B2 | 3/2011 | Lee et al. |

(Continued)

OTHER PUBLICATIONS

U.S. Appl. No. 15/151,951, filed May 11, 2016.

(Continued)

*Primary Examiner* — Son Mai
*Assistant Examiner* — Muna A Techane
(74) *Attorney, Agent, or Firm* — Vierra Magen Marcus LLP

(57) ABSTRACT

An erase operation includes one or more erase depth checks to detect the occurrence of shallow erased memory cells at the end of an erase process. Memory cells are subjected to erase and erase verification until erase verification success is achieved. At the end of successful erase verification, a subset of memory cells is read to detect an erase depth or level of the memory cells. If the erase depth check indicates that the subset memory cells are in a shallow erased condition, additional erasing and verification is performed.

17 Claims, 21 Drawing Sheets

(56) References Cited

U.S. PATENT DOCUMENTS

| | | |
|---|---|---|
| 7,965,554 B2 | 6/2011 | Lutze et al. |
| 8,014,209 B2 | 9/2011 | Lutze et al. |
| 8,130,551 B2 | 3/2012 | Oowada et al. |
| 8,144,511 B2 | 3/2012 | Dong et al. |
| 8,248,848 B1 | 8/2012 | Tang |
| 8,422,303 B2 | 4/2013 | Franca-Neto et al. |
| 8,488,382 B1 | 7/2013 | Li et al. |
| 8,493,781 B1 | 7/2013 | Meir et al. |
| 8,526,245 B2 | 9/2013 | Yoon et al. |
| 8,635,399 B2 | 1/2014 | Lee et al. |
| 8,649,215 B2 | 2/2014 | Franca-Neto et al. |
| 8,670,285 B2 | 3/2014 | Dong et al. |
| 8,743,615 B2 | 6/2014 | Lee et al. |
| 8,787,080 B2 | 7/2014 | Sommer et al. |
| 8,787,088 B2 | 7/2014 | Dutta et al. |
| 8,787,094 B2 | 7/2014 | Costa et al. |
| 8,824,211 B1 | 9/2014 | Costa et al. |
| 8,885,420 B2 | 11/2014 | Oowada et al. |
| 8,897,070 B2 | 11/2014 | Dong et al. |
| 8,913,431 B1 | 12/2014 | Costa et al. |
| 9,236,133 B2 | 1/2016 | Yanamanamanda et al. |
| 9,324,439 B1 | 4/2016 | Chen et al. |
| 9,330,779 B2 | 5/2016 | Mui et al. |
| 9,343,160 B1 | 5/2016 | Dutta et al. |
| 2008/0089132 A1 | 4/2008 | Ito |
| 2008/0266970 A1* | 10/2008 | Lee ................. G11C 16/10 365/185.19 |
| 2009/0154264 A1* | 6/2009 | Kux ................. G11C 16/3495 365/189.16 |
| 2010/0002515 A1 | 1/2010 | Lutze et al. |
| 2011/0103150 A1* | 5/2011 | Chan ................. G11C 16/0483 365/185.19 |
| 2012/0008405 A1 | 1/2012 | Shah et al. |
| 2012/0170365 A1 | 7/2012 | Kang et al. |
| 2012/0254515 A1* | 10/2012 | Melik-Martirosian ................. G11C 16/14 711/103 |
| 2012/0269020 A1 | 10/2012 | Park et al. |
| 2013/0007353 A1 | 1/2013 | Shim et al. |
| 2013/0070530 A1 | 3/2013 | Chen et al. |
| 2013/0314995 A1 | 11/2013 | Dutta et al. |
| 2014/0003147 A1* | 1/2014 | Dutta ................. G11C 11/5635 365/185.11 |
| 2014/0043916 A1 | 2/2014 | Costa et al. |
| 2014/0063949 A1* | 3/2014 | Tokiwa ................. G11C 16/16 365/185.11 |
| 2014/0136765 A1 | 3/2014 | Oh |
| 2014/0297924 A1 | 10/2014 | Sanda et al. |
| 2015/0003162 A1 | 1/2015 | Mui et al. |
| 2015/0071008 A1 | 3/2015 | Yang et al. |
| 2016/0163393 A1 | 6/2016 | Liang et al. |
| 2016/0172045 A1 | 6/2016 | Shukla et al. |
| 2016/0217860 A1 | 7/2016 | Lai et al. |

OTHER PUBLICATIONS

U.S. Appl. No. 15/069,287, filed Mar. 14, 2016.
U.S. Appl. No. 15/056,070, filed Feb. 29, 2016.
U.S. Appl. No. 15/087,242, filed Mar. 31, 2016.

* cited by examiner

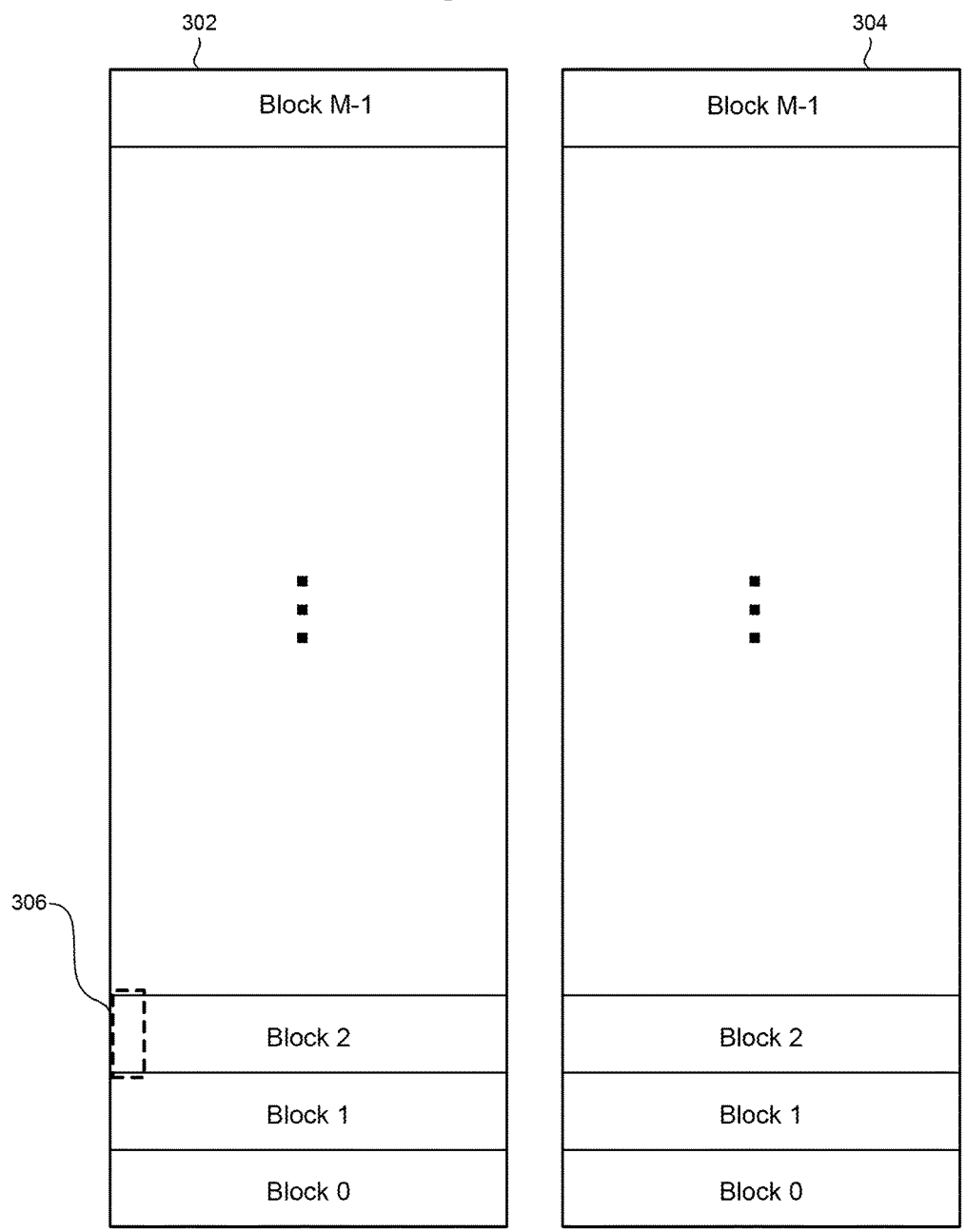

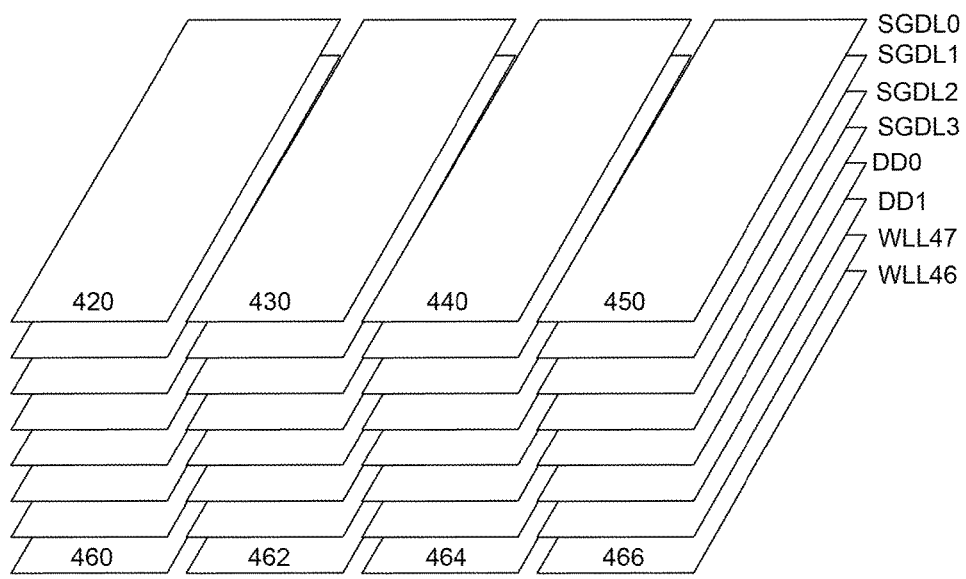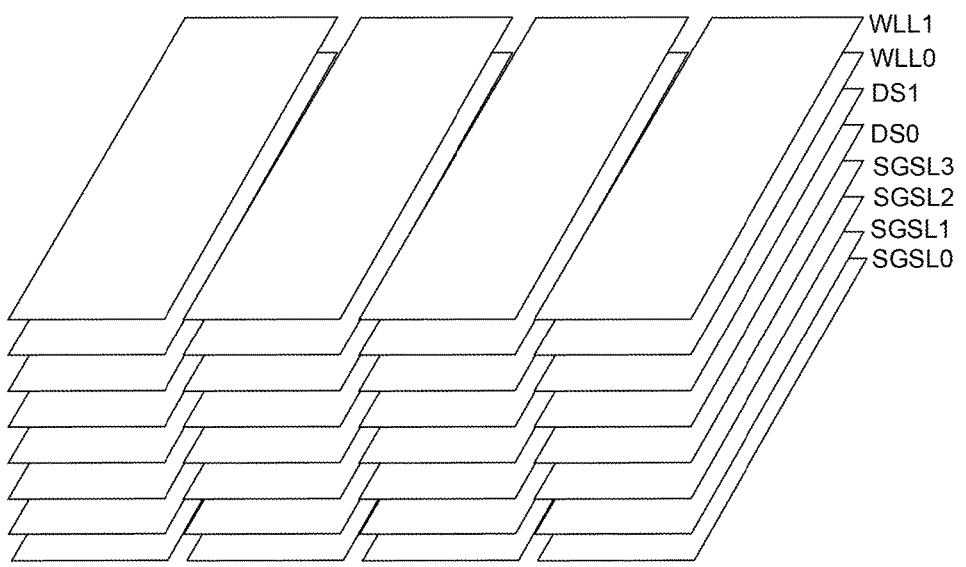
Figure 4D

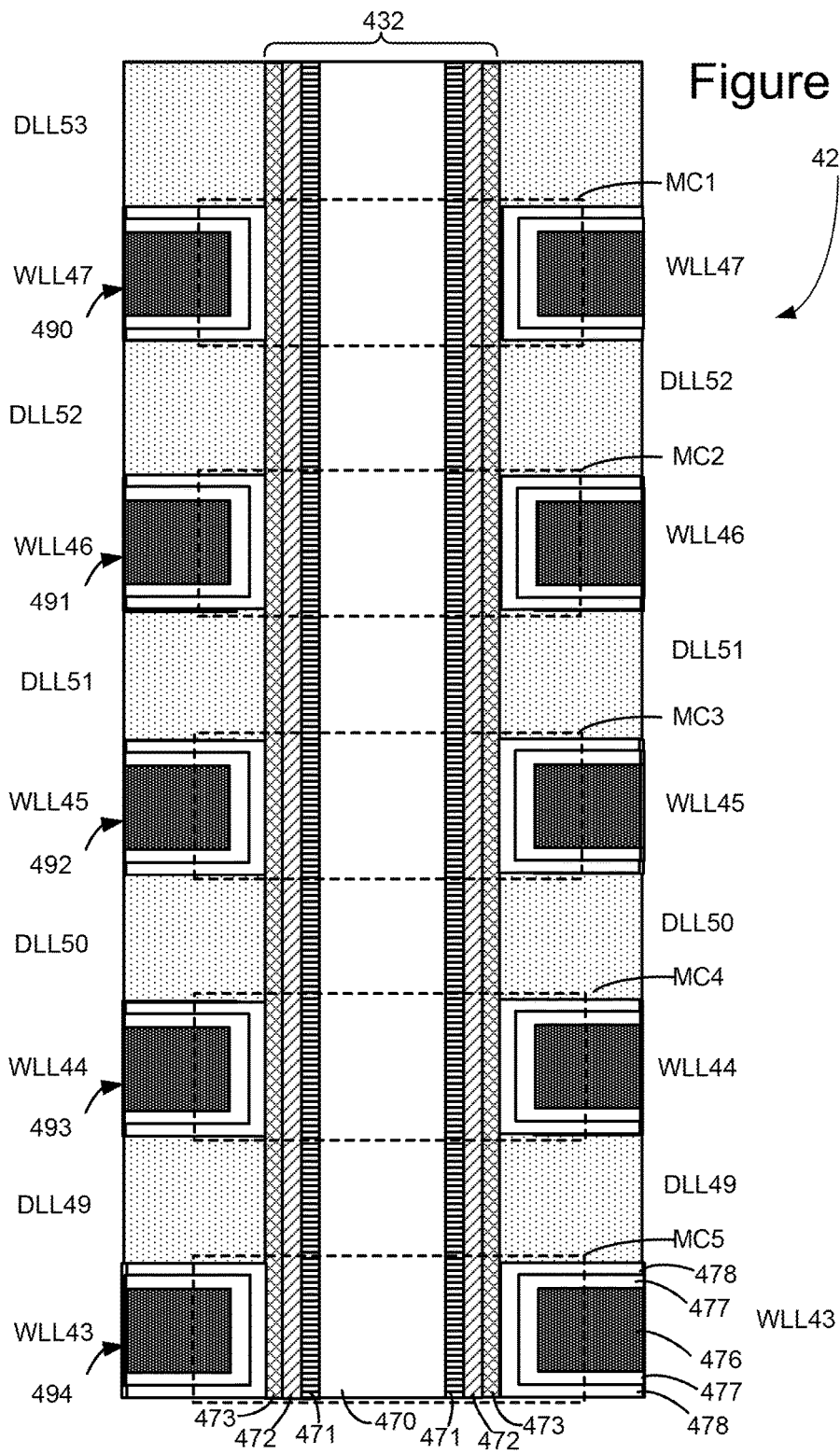

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

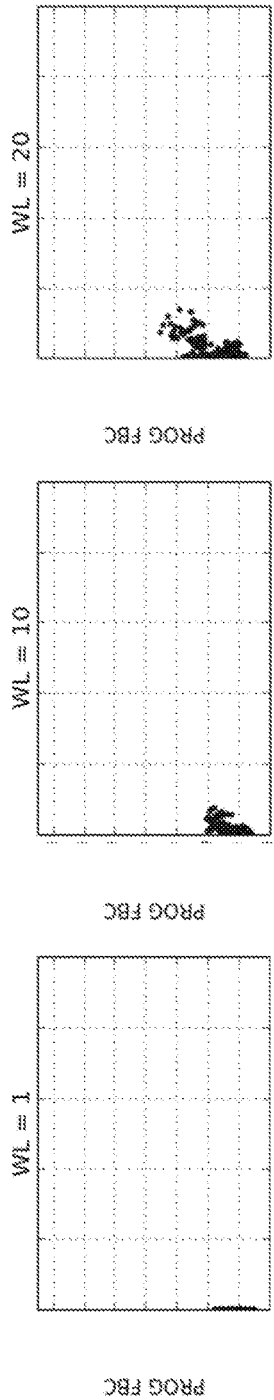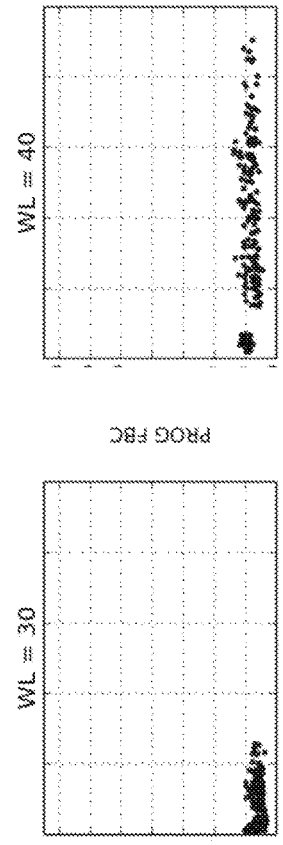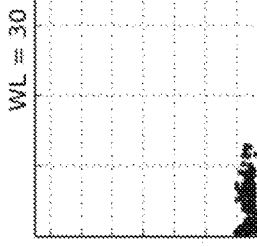
Figure 15A Figure 15B Figure 15C Figure 15D Figure 15E

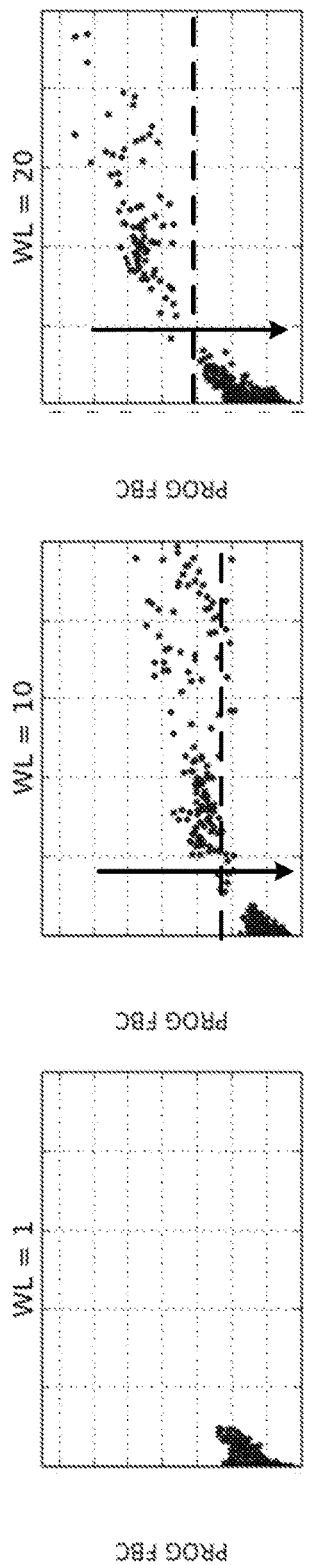
Figure 16A, Figure 16B, Figure 16C, Figure 16D, Figure 16E

ERASE FOR PARTIALLY PROGRAMMED BLOCKS IN NON-VOLATILE MEMORY

BACKGROUND OF THE INVENTION

Semiconductor memory devices have become more popular for use in various electronic devices. For example, non-volatile semiconductor memory is used in cellular telephones, digital cameras, personal digital assistants, mobile computing devices, non-mobile computing devices and other devices. Flash memory is among the most popular non-volatile semiconductor memories.

Some non-volatile memory devices are used to store two ranges of charges and, therefore, the memory cells can be programmed/erased between two data states: an erased state and a programmed state (corresponding to data "1" and data "0"). Such a device is referred to as a binary device or a single-level cell (SLC) and the data is binary data.

A multi-state flash memory cell (storing multi-state data) is implemented by identifying multiple, distinct allowed threshold voltage ranges (ie data states). Each distinct threshold voltage range corresponds to a predetermined value for the set of data bits. For example, some memory cells can store two bits, and others can store three bits. The specific relationship between the data programmed into the memory cell and the threshold voltage ranges (also called data states) of the memory cell depends upon the data encoding scheme adopted for the memory cells. For example, U.S. Pat. No. 6,222,762 and U.S. Patent Application Publication No. 2004/0255090, both describe various data encoding schemes for multi-state flash memory cells.

In addition to the gains in capacity resulting from multi-state memory architectures, consumers have seen significant advantages as a result of a history of steadily scaling down the physical dimensions of memory cells. Smaller memory cells can be packed more densely on a given die area, allowing the user to access more memory capacity for the same price as an older memory technology. In order to achieve the advantage of higher memory capacity for a fixed die size, these smaller memory cells must be packed more closely together. Doing so, however, may result in a greater number of operational errors, such as errors when programming data to the memory and/or reading back user data from the memory. The errors may result in increased processing times to recover the data, or in some instances a corruption of data that has been stored.

Once a non-volatile storage element has been programmed, it is important that its programming state can be read back with a high degree of reliability. However, the sensed programming state can sometimes vary from the intended programming state due to factors including noise and the tendency of devices to gravitate towards charge neutrality over time.

Consequently, it is common for to encounter erroneous or corrupted data bits at the time of reading non-volatile memory. Typically, some form of error correction control (ECC) is applied to correct erroneous or corrupted data. One common control stores additional parity bits to set the parity of a group of data bits to a required logical value when the data is written. The informational and parity bits form an encoded word stored during the write process. The ECC decodes the bits by computing the parity of the group of bits when reading the data to detect any corrupted or erroneous data. Despite these considerations, there remains a need for improved memory operations in on-volatile memory.

BRIEF DESCRIPTION OF THE DRAWINGS

Like-numbered elements refer to common components in the different figures.

FIG. 4A is a block diagram of a memory structure having two planes.

FIG. 4D depicts a view of the select gate layers and word line layers.

FIG. 4E is a cross sectional view of a vertical column of memory cells.

FIGS. 15A-15E are graphs of a program fail bit count versus an erase fail bit count for a fully programmed block.

FIGS. 16A-16E are graphs of a program fail bit count versus an erase fail bit count for a partially programmed block.

DETAILED DESCRIPTION

Figure 1:
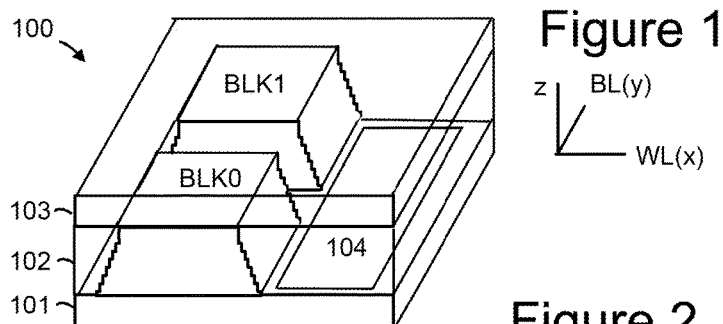
FIG. 1 is a perspective view of a 3D stacked non-volatile memory device.

The disclosed technology is directed to improved erase operations in non-volatile memory. A group of non-volatile memory cells such as a block is erased and subjected to erase verification. When the block is successfully verified as erased, an erase depth check is performed for a subset of memory cells of the block. If the subset of memory cells fails the erase depth check, the block or a portion of the block can be subjected to further erasing. In this manner, an additional operation to determine an erase level of a subset of memory cells is provided to detect the occurrence of shallow erased memory cells at the end of the erase process. If a shallow erase condition is detected for the subset of memory cells, the block or a portion of the block undergoes additional erasing to reduce the shallow erase condition. By detecting and eliminating shallow erased memory cells, errors when sensing data that is subsequently programmed to the non-volatile memory can be reduced.

Blocks of memory cells are typically programmed in a word line order. In some instances, a block may be partially programmed resulting in an open block condition where some word lines are programmed and some word lines are erased. In one embodiment, an erase operation includes an additional erase level check when a block is partially programmed prior to an erase operation. If the block is fully programmed, the erase operation includes one or more erase voltage pulses with intervening verification until the memory is erased. If the block is partially programmed, the erase operation includes the same erase and verification operations as a fully programmed block. An additional erase depth check, however, is performed at the end of successful erase verification, followed by additional erasing based on the results of the erase depth check.

If a partially programmed block is detected, the last word line to be programmed for the block is determined in one embodiment. After the partially programmed block passes erase verification, an erase depth check is performed for the last word line to be programmed. If the word line fails the erase depth check, the block is subjected to additional erasing and erase depth checking until the last word line passes the erase depth check. Different thresholds may be used for different word lines of a block to detect shallow erased conditions, or the same threshold may be used for each word line.

In another embodiment, one or more predetermined word lines of the block are subjected to erase depth checking for a partially programmed block. After the block passes erase verification, the erase depth check is performed for the one or more word lines. If any one of the predetermined word lines fails the erase depth check, additional erasing and depth checking is performed.

If multiple predetermined word lines are used, an erase depth check may be performed for each predetermined word line independently by comparing the number of memory cells above the read reference voltage for each word line with a threshold. In another embodiment, an erase depth check may be performed for multiple word lines by comparing the total number of memory cells of all predetermined word lines with the threshold.

In one embodiment, the read reference voltage used during the erase depth check is lower than the erase verify voltage used during erase verification. This technique may amplify the fail bit count for the erased condition to detect potential shallow erased conditions.

FIGS. 1-4F describe one example of a memory system that can be used to implement the technology proposed herein. FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
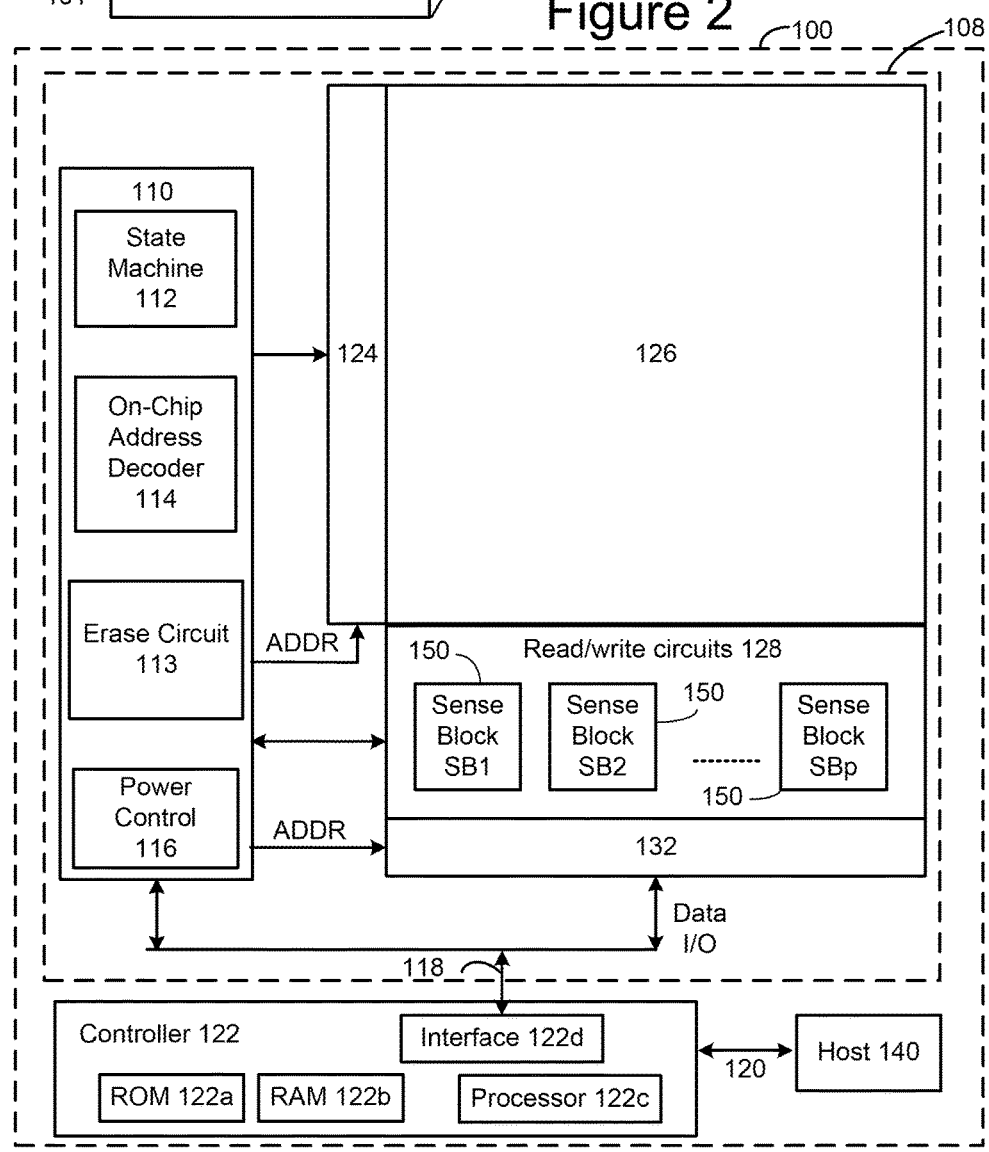
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separate from the memory die 108. In some embodiments the controller will be on a different die than the memory die. In some embodiments, one controller 122 will communicate with multiple memory die 108. In other embodiments, each memory die 108 has its own controller. Commands and data are transferred between the host 140 and Controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Erase circuit 113 is configured to erase one or more portions of the non-volatile memory array 126. Although shown within control circuitry 110, erase circuit 113 may alternately be formed in read/write circuits 128 or controller 122. Erase circuit 113 may include circuits for erasing, performing erase verification, and performing erase depth check operations as described hereinafter. The erase circuit includes a means for erasing non-volatile memory such as a portion or all of a plurality of non-volatile memory cells and means for determining an erase level of a subset of the non-volatile memory cells. The erase circuit may include means for verifying a plurality of memory cells and means for performing an erase depth check.

In one embodiment, state machine 112 is programmable by software and/or firmware stored in a storage area of control circuitry 110. The storage may store operational parameters and software which is used to program state machine 112. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 includes a memory interface that provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, erase circuit 113, power control module 116, sense blocks 150, read/write circuits 128, and controller 122 can be considered one or more control circuits (or a managing circuit) that perform the functions described herein. Reference to a control circuit or the control circuit is intended to refer to one or more control circuits. The control circuit includes a plurality of electronic components that provide multiple current paths for complex operations on the memory die 108 and/or off the memory die (e.g., by controller 122). In this manner, a circuit is a well-understood physical structure requiring electronic components and an interconnection of the components by vias, paths, and/or wires through which current flows.

The (on-chip or off-chip) controller 122 (which in one embodiment is an electrical circuit) may comprise a processor 122c, ROM 122a, RAM 122b and a Memory Interface 122d, all of which are interconnected. Processor 122C is one example of a control circuit. Other embodiments can use state machines or other custom circuits designed to perform one or more functions. The storage devices (ROM 122a, RAM 122b) comprise code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
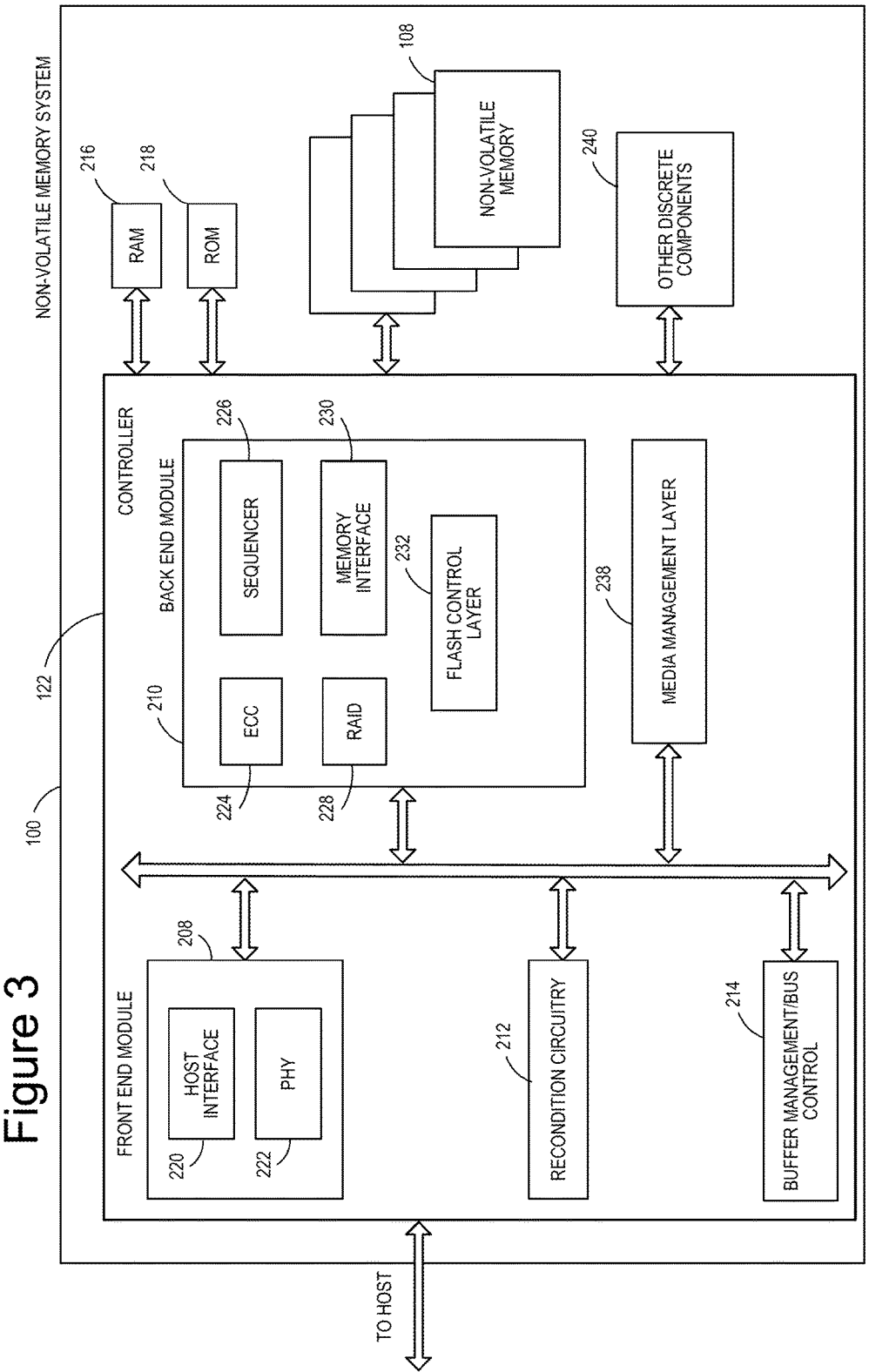
FIG. 3 is a block diagram depicting one embodiment of a controller.

FIG. 3 is a block diagram of example memory system 100, depicting more details of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 3, controller 112 includes a front end module 208 that interfaces with a host, a back end module 210 that interfaces with the one or more non-volatile memory die 108, and various other modules that perform functions which will now be described in detail.

The components of controller 122 depicted in FIG. 3 may take the form of a packaged functional hardware unit (e.g., an electrical circuit) designed for use with other components, a portion of a program code (e.g., software or firmware) executable by a (micro)processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 3 is one example implementation that may (or may not) use the components of controller 122 depicted in FIG. 2 (i.e. RAM, ROM, processor, interface).

Controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of controller 122. A read only memory (ROM) 218 stores system boot code. Although illustrated in FIG. 3 as located separately from the Controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction control (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In in one embodiment, Controller 122 and multiple memory dies (together comprising non-volatile storage system 100) implement a solid state drive (SSD), which can emulate, replace or be used instead of a hard disk drive inside a host, as a NAS device, etc. Additionally, the SSD need not be made to work as a hard drive.

Figure 4:
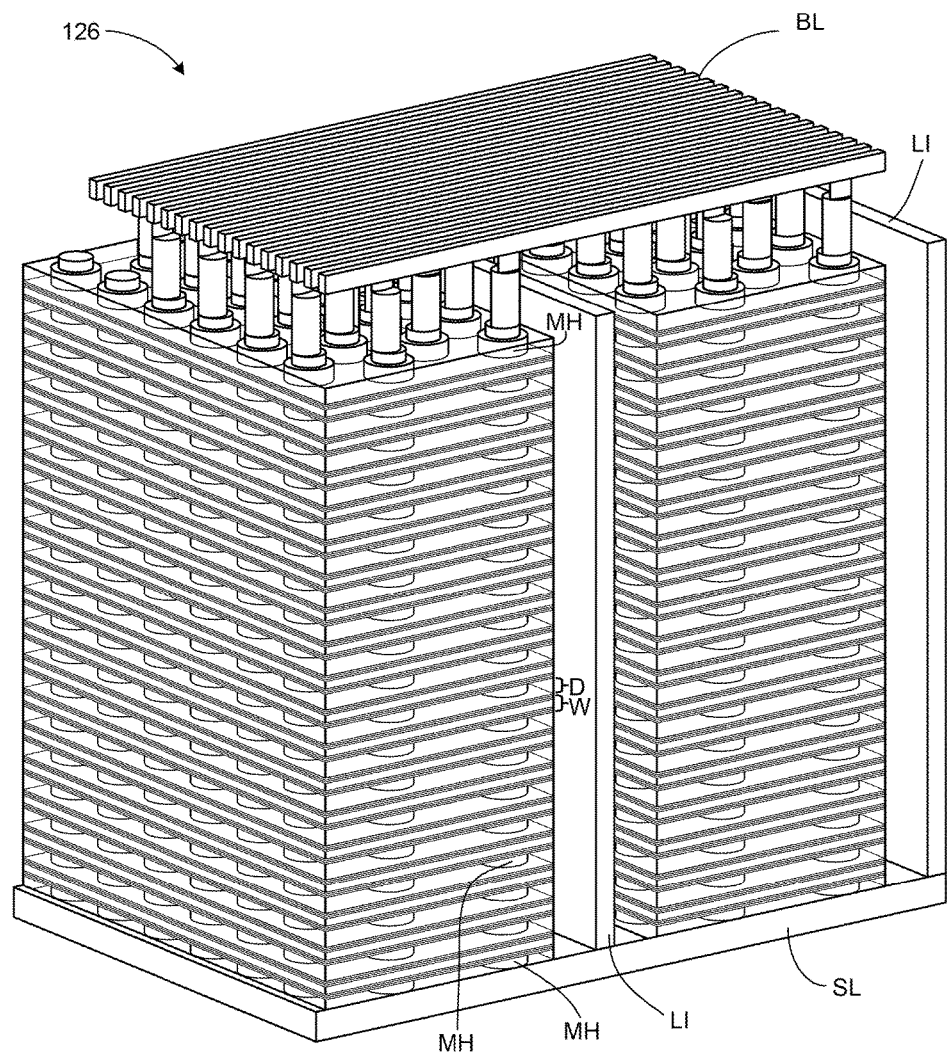
FIG. 4 is a perspective view of a portion of a three dimensional monolithic memory structure.

FIG. 4 is a perspective view of a portion of a three dimensional monolithic memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIG. 4A-4G.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
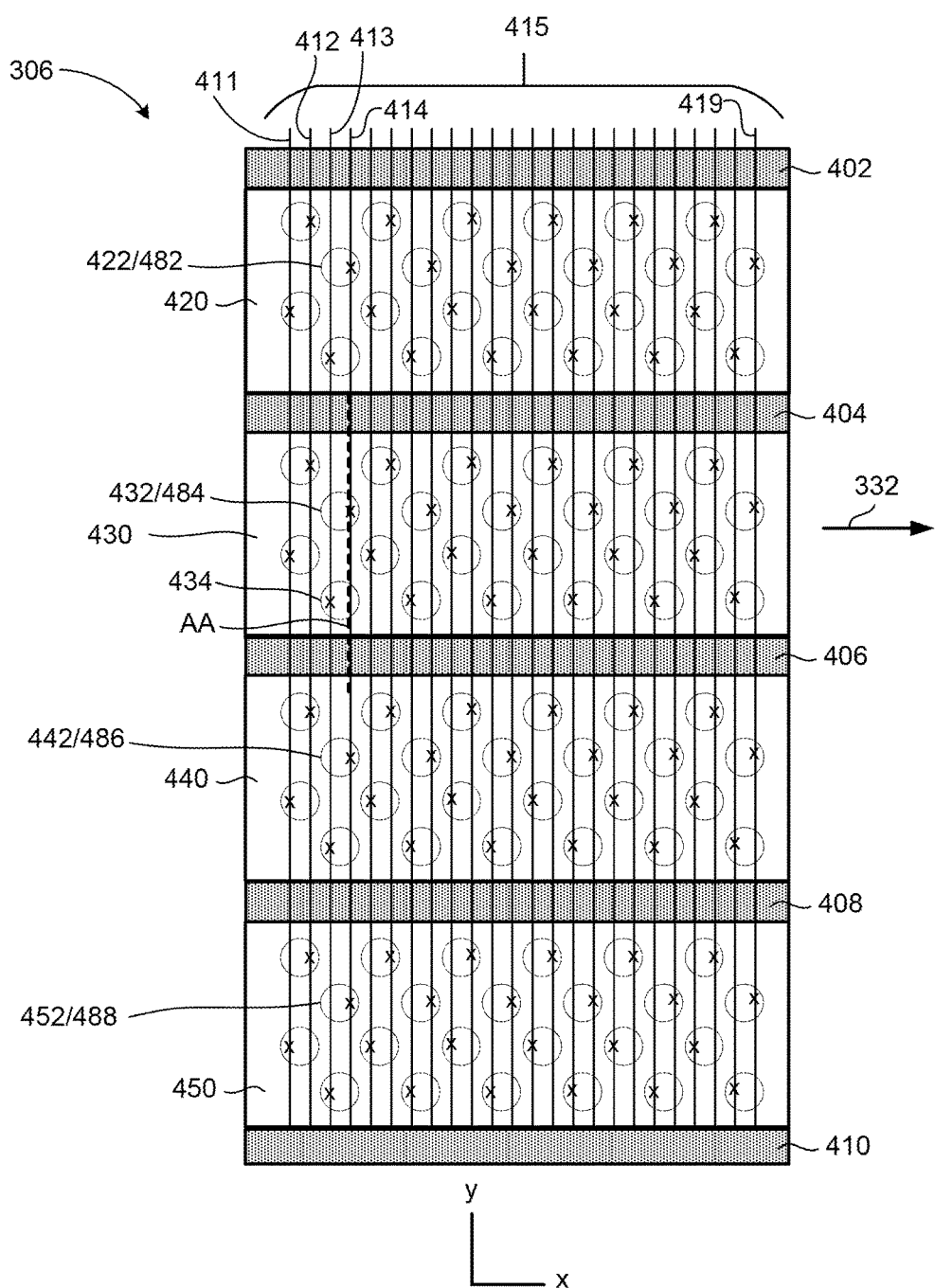
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
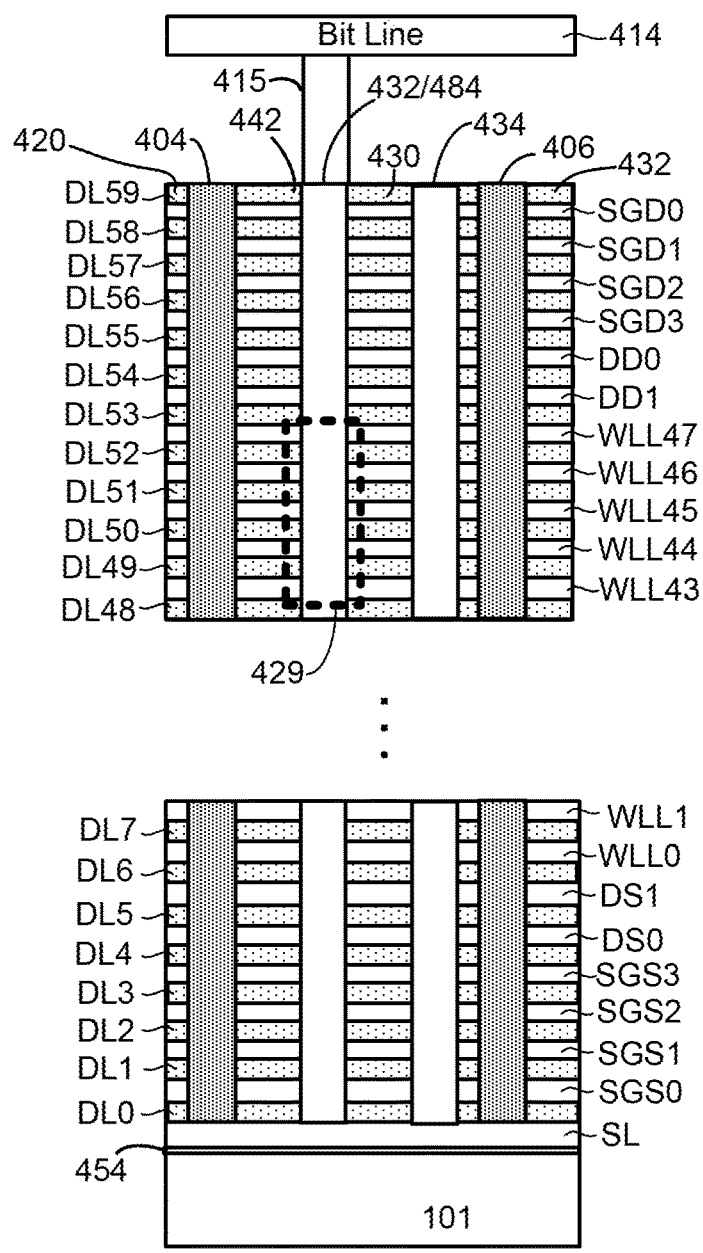
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4D depicts a logical representation of the conductive layers (SGD0, SGD1, SGD2, SGD3, SGS0, SGS1, SGS2, SGS3, DD0, DD1, DSO, DS1, and WLL0-WLL47) for the block that is partially depicted in FIG. 4C. As mentioned above with respect to FIG. 4B, in one embodiment local interconnects 402, 404, 406, 408 and 410 break up each conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
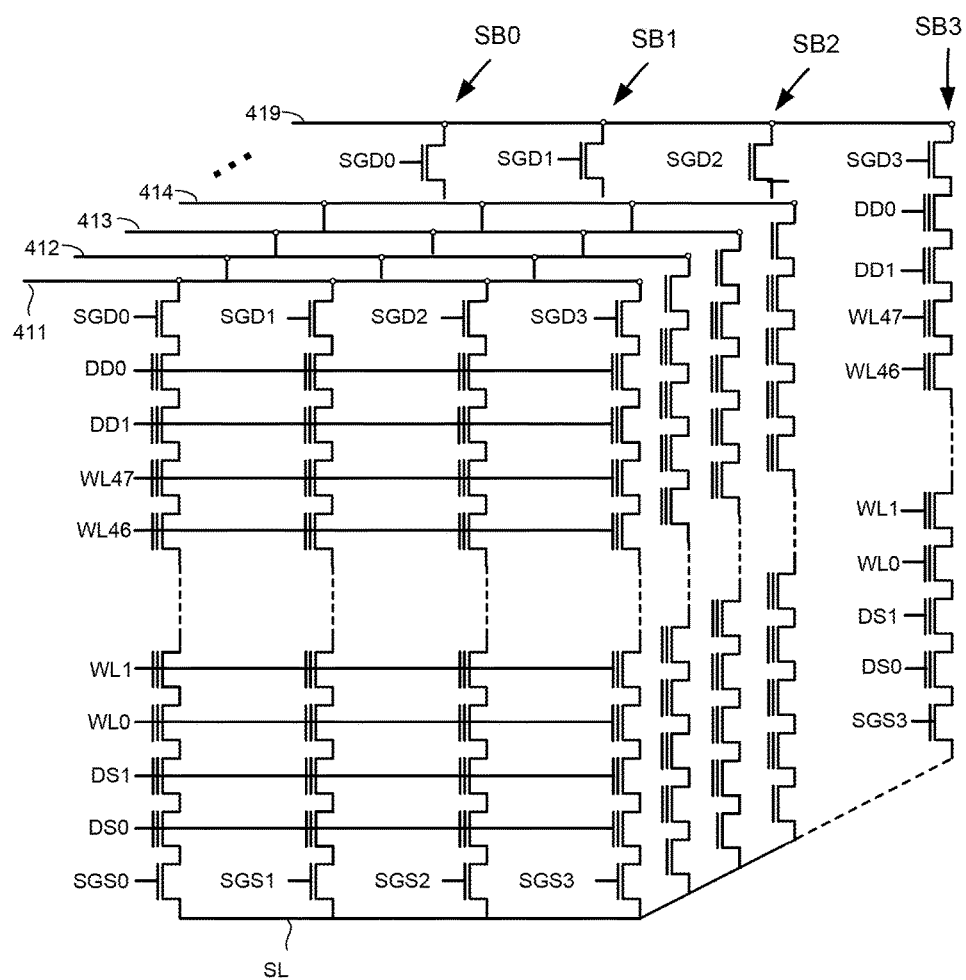
FIG. 4F is a schematic of a plurality of NAND strings.

FIG. 4F shows physical word lines WLL0-WLL47 running across the entire block. The structure of FIG. 4G corresponds to portion 306 in Block 2 of FIGS. 4A-F, including bit lines 411, 412, 413, 414, . . . 419. Within the block, each bit line connected to four NAND strings. Drain side select lines SGD0, SGD1, SGD2 and SGD3 are used to determine which of the four NAND strings connect to the associated bit line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 4-4F is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

Figures 5, 5A:
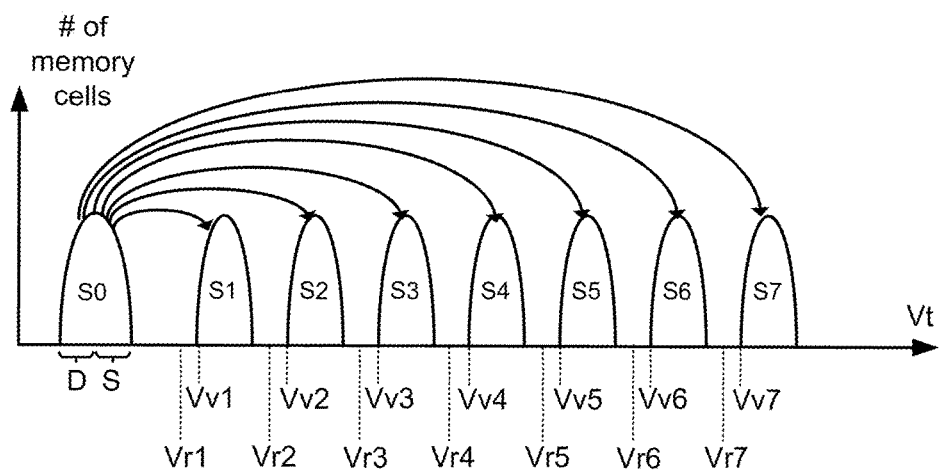
FIG. 5 depicts threshold voltage distributions.
FIG. 5A is a table describing one example of an assignment of data values to data states.

At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing whether the threshold voltage of a given memory cell is above or below the seven read reference voltages, the system can determine what data state (i.e., S0, S1, S2, S3, . . . ) the memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-D7 can overlap, with controller 122 relying on ECC to identify the correct data being stored.

FIG. 5A is a table describing one example of an assignment of data values to data states. In the table of FIG. 5A, S0-111. S1=110, S2=200, S3=000, S4=010, S5=011, S6=001 and S7=101. Other encodings of data can also be used. No particular data encoding is required by the technology disclosed herein.

Figure 6A:
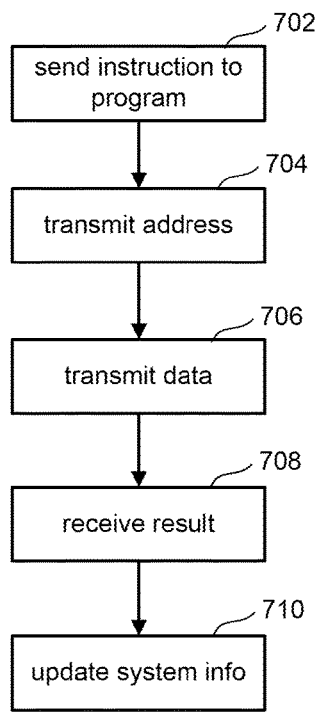
FIG. 6A is a flow chart describing one embodiment of a process for programming.

FIG. 6A is a flowchart describing one embodiment of a process for programming that is performed by controller 122. In some embodiments, rather than have a dedicated controller, the host can perform the functions of the controller. In step 702, controller 122 sends instructions to one or more memory die 108 to program data. In step 704, controller 122 sends one or more logical addresses to one or more memory die 108. The one or more logical addresses indicate where to program the data. In step 706, controller 122 sends the data to be programmed to the one or more memory die 108. In step 708, controller 122 receives a result of the programming from the one or more memory die 108. Example results include that the data was programmed successfully, an indication that the programming operation failed, and indication that the data was programmed but at a different location, or other result. In step 710, in response to the result received in step 708, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, controller 122 would receive user data and an instruction to program from the host, and the Controller would run the ECC engine to create code words from the user data. These code words are the data transmitted in step 706. Controller can also scramble the data to achieve wear leveling with respect to the memory cells.

Figure 6B:
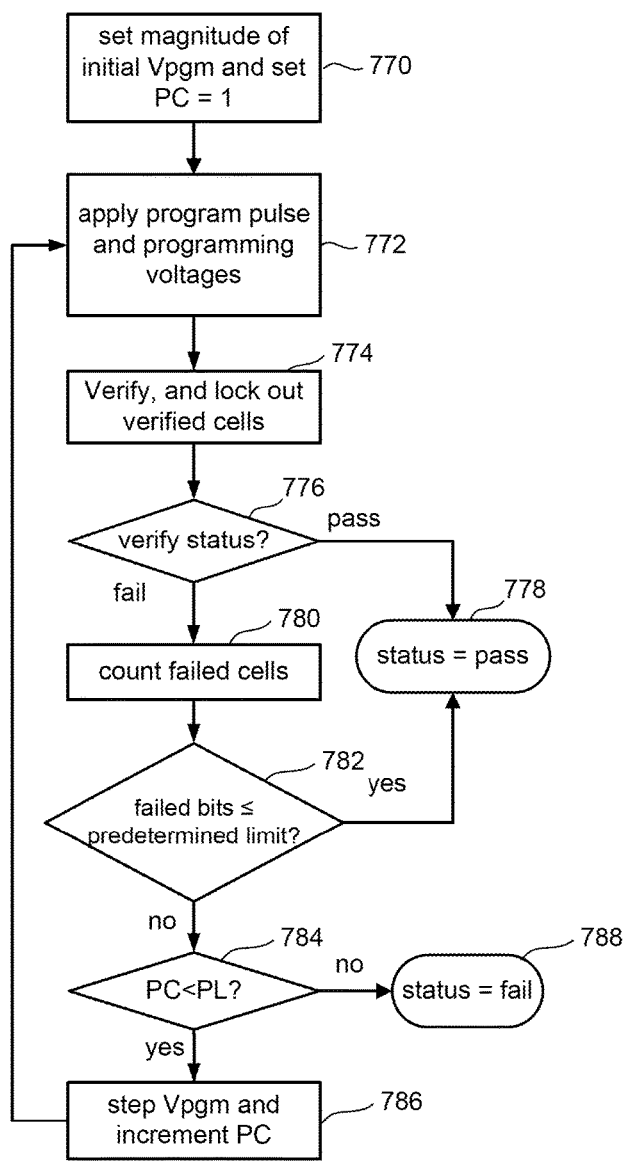
FIG. 6B is a flow chart describing one embodiment of a process for programming.

FIG. 6B is a flowchart describing one embodiment of a process for programming. The process of FIG. 6B is performed by the memory die in response to the steps of FIG. 6A (ie in response to the instructions, data and addresses from controller 122). In one example embodiment, the process of FIG. 6B is performed on memory die 108 using the one or more control circuits discussed above, at the direction of state machine 112. The process of FIG. 6B can also be used to implement the full sequence programming discussed above. Additionally, the process can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 6B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd (e.g., 2.5V) to inhibit programming. In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the Controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, then the programming process continues at step 784 and the program counter PC is checked against the program limit value (PL). Examples of program limit values include 20 and 30; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line.

In one embodiment, data is programmed in units of pages. So, for example, the process of FIG. 6B is used to program one page of data. Because it is possible that errors can occur when programming or reading, and errors can occur while storing data (e.g., due to electrons drifting, data retention issues or other phenomenon), error correction is used with the programming of a page of data. Many ECC coding schemes are well known in the art.

Typically blocks are programmed by programming one or more pages to each word line of the block in a word line order. Often, a block of memory cells is completely programmed during a single program operation. In some instances, however, only a portion of a block may be programmed. For example, the data for a write operation may only occupy a portion of one block or may occupy one or more complete blocks and a portion of another memory block. The blocks that have not been fully programmed are often referred to as partially programmed or open blocks, referring to the open word lines that have not been subjected to programming since a previous erase operation. The word lines that have been subjected to programming since the previous erase operation may be referred to as a closed word lines.

A memory system may erase a partially programmed block prior to programming the block or in response to other memory operations. When erasing a partially programmed block, the word lines and corresponding memory cells of the block are in different states or conditions prior to the erase operation. A first group of word lines have been subjected to programming since the previous erase operation, and a second group of word lines have not been subjected to programming since the previous erase operation. Consequently, the memory cells of the first group of word lines may be in the erased state or one of the programmed states, while all of the memory cells of the second group are in the erased state. The different conditions of the memory cells may lead to variances in the memory cells after erasure. After the memory cells are programmed, these variances may in turn lead to errors when reading back the programmed data.

In particular, erasing an open or partially programmed block may lead to shallow erase issues on certain word lines of the block. These shallow erased word lines can cause higher program disturb once the block is programmed back after the erase operation. Because the memory cells are only shallow erased, they have a higher tendency to inadvertently move to the first programmed state during programming, even when the memory cell is intended to remain in the erased state. The higher program disturb leads to increased errors when reading back these memory cells after programming. These increased errors can be seen as increased fail bit counts on particular word lines.

FIGS. 7A-7D illustrate that open block erasing results in shallow erasing on certain word lines (e.g., WL20-WL32), which is reflected as a higher fail bit count once the block is programmed. The data in FIGS. 7A-7D is exemplary only and is not intended to be limiting.

Figure 7A:
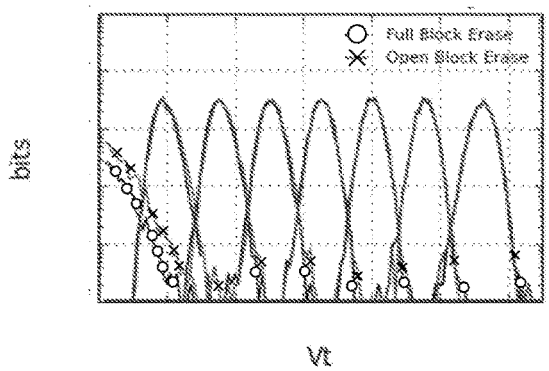
FIGS. 7A-7D are graphs describing the effects of erasing a partially programmed block.

FIG. 7A is a graph comparing the threshold voltage distributions for a block of memory cells after programming. A first line 602 represents the threshold voltage distribution for the block when the block is fully programmed prior to being erased for the current program operation. A second line 604 represents the threshold voltage distribution for the block when the block is only partially programmed prior to being erased for the current program operation. While the distributions are similar, a distinct difference around the erased and first programmed state distributions can be seen. The fully programmed block has a lower erase state threshold distribution when compared with the partially programmed block erased state threshold distribution. This increased threshold voltage distribution for the erased state may lead to increased fail bit counts for particular word lines.

Figure 7B:
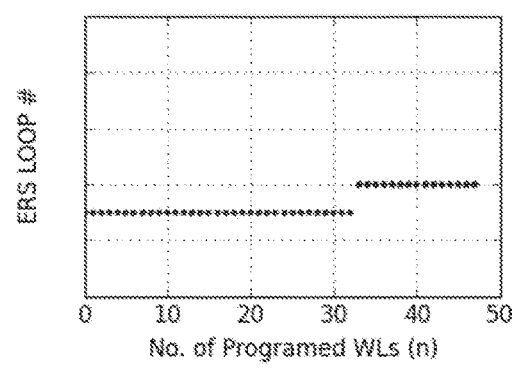

FIG. 7B is a graph depicting the number of erase loops on the y-axis as a function of the number of programmed word lines for a block. The block requires a first number of erase loops (e.g., two) to erase the block when the number of word lines of the block that have been programmed prior to erase is between 0 and a first value that includes slightly more than half of the word lines. When the number of programmed word lines is larger than the first value, the number of required erase loops increases to a larger number (e.g., four).

Figure 7C:
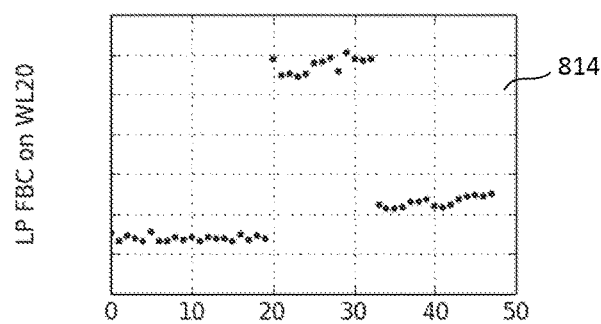

FIG. 7C is a graph depicting the lower page fail bit count on a particular word line (e.g., WL20) along the y-axis as a function of the number of programmed word lines. While WL20 is shown for example, other word lines exhibit similar behavior. FIG. 7C shows that the fail bit count (FBC) is around a first level when the number of programmed word lines is between 0 and 20. When the number of programmed word lines increases, the FBC increases to a second level. The FBC remains at this second level until the number of word lines that are programmed reaches 31. When the number of programmed word lines reaches 32, the fail bit count decreases to a third level that is between the first level and the second level. The decrease may be attributable to the extra erase loop that is performed once the number of programmed word lines reaches 32.

FIG. 7C illustrates that that the fail bit count for the last word line to be programmed will be higher than other word lines of the block that have not been subjected to programming since the last erase operation.

Figure 7D:
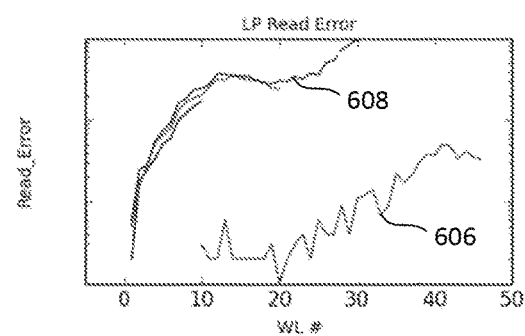

FIG. 7D is a graph depicting the shallow erase bits obtained by an erase depth check, after open block erase operation. Line 606 shows the shallow erase bits for the block when the block is fully programmed prior to erasing. Line 608, shows the shallow erase bits when the block is only partially programmed prior to erasing. For example, line 608 shows the error when the number of programmed word lines is slightly more than half of the word lines in the block.

Figure 8:
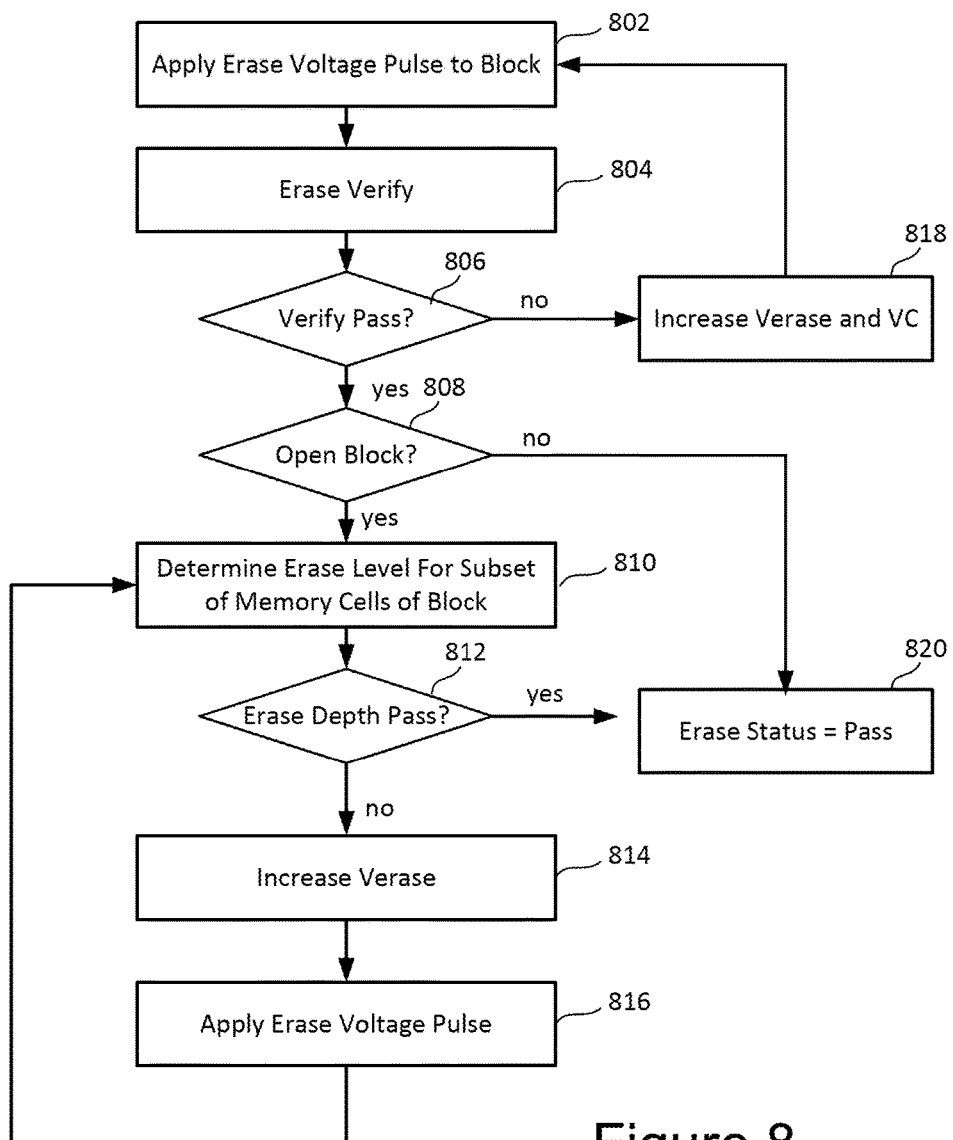
FIG. 8 is a flow chart describing one embodiment of a process for erasing.

FIG. 8 is a flowchart describing one embodiment of a process for performing an erase operation for a block of memory cells, including an erase level check for a subset of the block of memory cells. The process of FIG. 8 may be performed by any of the one or more control circuits (hereinafter "a control circuit" may be used to refer to one or more control circuits) described above with respect to FIGS. 2 and 3 in conjunction with the three dimensional memory structure of FIGS. 4-4F. For example, the process of FIG. 8 may be performed by controller 122 and/or control circuitry 110. In FIG. 8, a process for erasing data from a group of memory cells includes performing an erase depth check to determine an erase level of a subset of memory cells after successfully verifying the group. The group is subjected to additional erasing if the erase depth check fails, such as by the erase level of the subset of memory cells being above a threshold.

At step 802, the control circuit applies an erase voltage pulse to the block of memory cells. In one embodiment, step 802 includes applying an erase enable voltage to the word lines of the block, while applying the erase voltage pulse to a common p-well region for the block of memory cells. In another embodiment, step 802 includes applying an erase enable voltage to the word lines of the block, while applying the erase voltage pulse to the bit lines for the group of memory cells. Step 802 can include applying the erase voltage pulse to the substrate or a source line. The erase voltage signal typically includes a series of erase voltage pulses that are incremented by a step size over the magnitude of the previously applied erase voltage pulse. The starting level of the first erase voltage pulse can be chosen so that most or nearly all blocks are erased with one erase voltage pulse. Various staring pulse levels and increment sizes can be used. In one example, the starting erase pulse is between 15V and 20V and the increment value is 1V.

Figure 9:
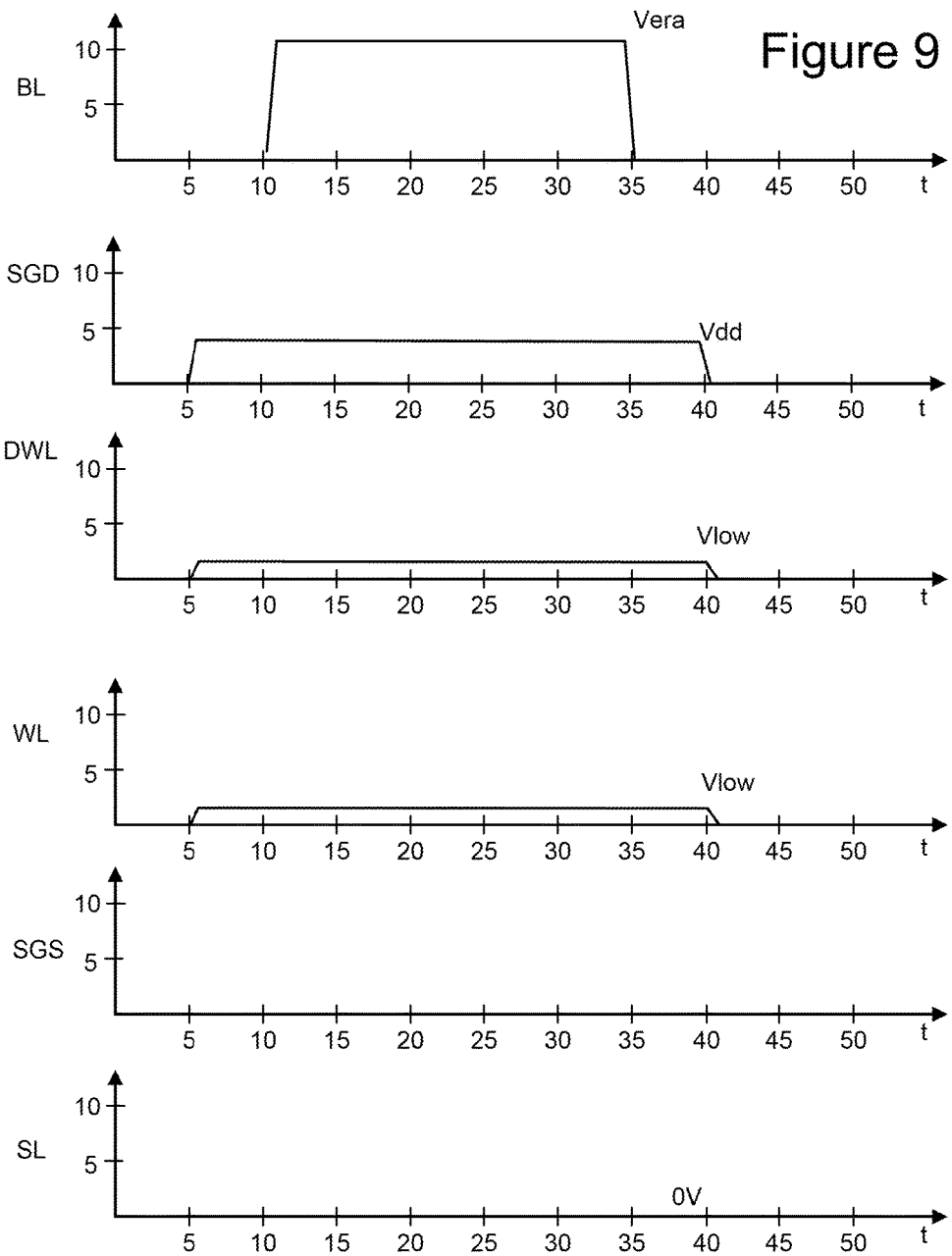
FIG. 9 is a signal diagram depicting the behavior of various signals during an erase operation.

FIG. 9 is a timing diagram describing an erase operation according to one embodiment. FIG. 9 depicts the behavior of signals or waveforms for the bit line BL, drain side select gate line(s) SGD, dummy word lines DWL, memory word lines WL, source side select gate line(s) SGS, and source line SL. In one embodiment, the entire block is a unit of erase such that all memory cells of the block will be erased concurrently. Therefore, every bit line will receive the same bit line BL signal. The drain select gate SGD signal represents the voltage on each of the drain side select lines SGD0, SGD1, SGD2, and SDG3. In one embodiment, all four of the drain side select lines receive the same signal. The dummy word line DWL signal is the voltage on the dummy word lines. The memory word line WL signal is the voltage applied to all of the word lines of the block. The select gate source SGS signal is the signal on the source side select lines including SGS0, SGS1, SGS2, and SGS3. The source line SL signal is the voltage on the source line. Each of the graphs depicted in FIG. 9 describe voltage over time. The graphs show time increments of 5, 10, 15, . . . These times are arbitrary and are used only as a reference for indicating the behavior of the voltage signals. At time 5 SGD is raised to Vdd, DWL is raised to Vlow, and WL is raised to Vlow. Throughout the timeframe depicted in FIG. 9, SGS and SL remain at ground. In one embodiment, Vdd is a voltage between 2.5 and 3.2 volts; however, other voltage values can be used. In one embodiment, Vlow is a low voltage that is close to 0 volts; for example, Vlow can be equal to 0.6 volts or another value near 0 volts. In some embodiments, Vlow can be 0 volts. At time 10, an erase pulse is applied to the bit line; for example, FIG. 9 shows BL being raised to Vera (approximately 20 volts) and then lowered to ground at time 35. At time 40, SGD, DWL, and $V_{WL}$ are brought down to ground.

In one embodiment, the channel of an NAND string (memory hole) is charged up during an erase. In the embodiment of FIG. 9, the channel is charged by applying a high voltage to the bit line. The large erase pulse at Vera causes hole injection into the charge trapping layer via gate induced drain leakage. In an alternative embodiment, a high voltage can be applied to the source line $V_S$ to charge the channel.

FIG. 9 depicts an erase operation that applies one erase pulse. After an erase pulse is provided, the system will perform an erase verify to see whether all (or a sufficient number) of the memory cells are properly erased. If it is determined that not all memory cells are properly erased, then the operation depicted in FIG. 9 will be repeated and another verify performed until all memory cells are properly erased.

Returning to FIG. 8 and step 804, the one or more control circuits perform an erase verification operation for the block of memory cells. In one embodiment, step 804 may include verifying the individual NAND strings of the block for the erased state. Erase verification can be performed by applying an erase verify voltage Everify (e.g., 0.4-0.7V) to each word line of the block, while turning on the select gates of the string, grounding the bit line, and applying a positive voltage (e.g., Vdd) to the source line. After a predetermined period of time, the bit line voltage of each NAND string is sensed. If the threshold voltage of each memory cell of the string is less than the voltage Everify, the string will provide a conduction path from source line to bit line and the bit line voltage will rise in accordance with the threshold voltage of the erased memory cells. If the bit line charges to a predetermined level indicative of each cell having a threshold voltage lower than the Everify level, the NAND strings is determined to have been sufficiently erased. Step 804 can include performing verification of multiple NAND strings of the block in parallel.

At step 806, the control circuit determines whether each NAND string was successfully verified at step 804 for the erased state. Step 806 may include determining if every NAND string of the block and/or a predetermined number of NAND strings of the block is successfully verified as erased.

If all or the predetermined number of NAND strings are not successfully verified for the erased state at step 806, the erase operation continues at step 818. The erase voltage Verase is incremented or stepped up by a predetermined step size and a verify counter VC indicating the number of iterations of the erase operation is increased. After setting the magnitude of the erase voltage pulse for the next iteration of the erase operation, the process returns to step 802 to bias the NAND string(s) and apply the next erase voltage pulse for further erasing.

If the block passes the verification operation at step 806, the process continues at step 808 where the control circuit determines whether the block was an open block prior to the current erase operation. The control circuit determines whether the block was subjected to partial programming after the previous erase operation and before the current erase operation. In one embodiment, the control circuit stores an indication, in the non-volatile memory or elsewhere, of whether a block has been subjected to partial programming or not. At step 808, the control circuit may check the indication for the current block to determine whether it was subjected to partial programming after the previous erase operation. In one example, step 808 is performed by controller which may track which blocks are open. The controller may further track the last closed word line of the block, referring to the last word line to be programmed in the partially programmed block. In another example, control circuitry 110 on the memory die may track which blocks are open, and the last closed word line for those blocks. In one embodiments, step 808 is performed by controller 122, while the remaining steps 802-806 and 810-816 are performed by control circuitry 110.

If the block was not subjected to partial programming after the previous erase operation, the erase operation completes at step 820 based on the block passing the erase verification operation. At step 820, a status of pass may be reported to the controller and/or a host device.

If the block was partially programmed after the previous erase operation, the erase operation continues at step 810. The control circuit determines an erase level for a subset of memory cells of the block at step 810. In one embodiment, step 810 includes checking an erase depth of the memory cells on one or more word lines of the block. The one or more word lines may be one or more predetermined word lines of the block or may be one or more dynamically determined word lines such as a last word line to be programmed for the block after the previous erase operation and prior to the current erase operation. The control circuit may perform a read operation for the one or more word lines in one embodiment to determine an erase level for each memory cell of the one or more word lines. For example, the control circuit may apply a read reference voltage to a word line to determine an erase condition of the memory cells. The read reference voltage is lower than the erase verify voltage in one embodiment. The read reference voltage can be used to detect memory cells having a shallow erase depth (e.g., close to the erase verify level). The lower read reference voltage can be used to amplify the shallow erase bit count.

At step 812, the control circuit determines whether the one or more word lines passed the erase depth check operation. A memory cell with a threshold voltage above the read reference voltage will not conduct during the read operation indicating that the memory cell has a shallow erase depth. The control circuit counts the number of memory cells that have a threshold voltage above the read reference voltage for the erased condition. Step 812 can include counting the number of bits in the bit line latches indicating that a memory cell did not conduct during the read operation. A scan or similar operation can be used at step 812 in one embodiment. The control circuit compares the number of memory cells above the read reference voltage with a threshold number. If the number of memory cells or bits is below the threshold, the erase depth operation is determined to pass at step 812. If the number is above the threshold, the erase depth operation is determined to fail at step 812.

The erase depth check at steps 810 and 812 may be performed in various ways. In one embodiment, a single word line such as the last word line to be programmed for the partially programmed block is determined. At step 810, the single word line is read and the number of cells or bits above the read reference voltage is compared against the threshold.

In another embodiment, multiple word lines can be checked at step 810. For example, in a system where the last word line to be programmed is unknown, the control circuit may perform an erase depth check on multiple predetermined word lines. The control circuit may perform the erase depth check on each word line independently or may perform the erase depth check on the word lines together. For example, the controller may compare the number of memory cells above the read reference voltage on one word line with a threshold. If the number if above the threshold, the erase depth check may be determined to fail at step 812. The controller may compare the number of memory cells on additional word lines with the same or a different threshold. If the number on any word line exceeds the threshold, the erase depth check is determined to fail. Alternatively, the control circuit may determine whether the combined number for a subset of word lines exceeds a threshold.

If the number of memory cells exceeds the threshold, indicating that the subset of memory cells is shallow erased, the erase depth check is determined to fail at step 812. At step 814, the control circuit increases the erase voltage Verase by an increment value or step size and applies an erase voltage pulse at step 816. The control circuit may use the same or a different step size at steps 814 and 818. In one embodiment, step 814 includes determining the final erase voltage pulse size applied at step 802 prior to the block passing erase verification at step 806. The control circuit increases the erase voltage Verase from its final value at step 802 by the step size at step 814. Although not shown, the system may use a counter to limit the number of cycles of the erase depth check, similar to the counter used to limit the number of cycles of erase verification.

If the subset of memory cells passes the erase depth check at 812, the erase operation completes at step 820. At step 820, a status of pass may be reported to the controller and/or a host device. In this manner, the block of memory cells passes the erase operation based on erase verification alone when the block is fully programmed, but only passes the erased operation based on erase verification and an erase depth check when the block is partially programmed.

Figure 10:
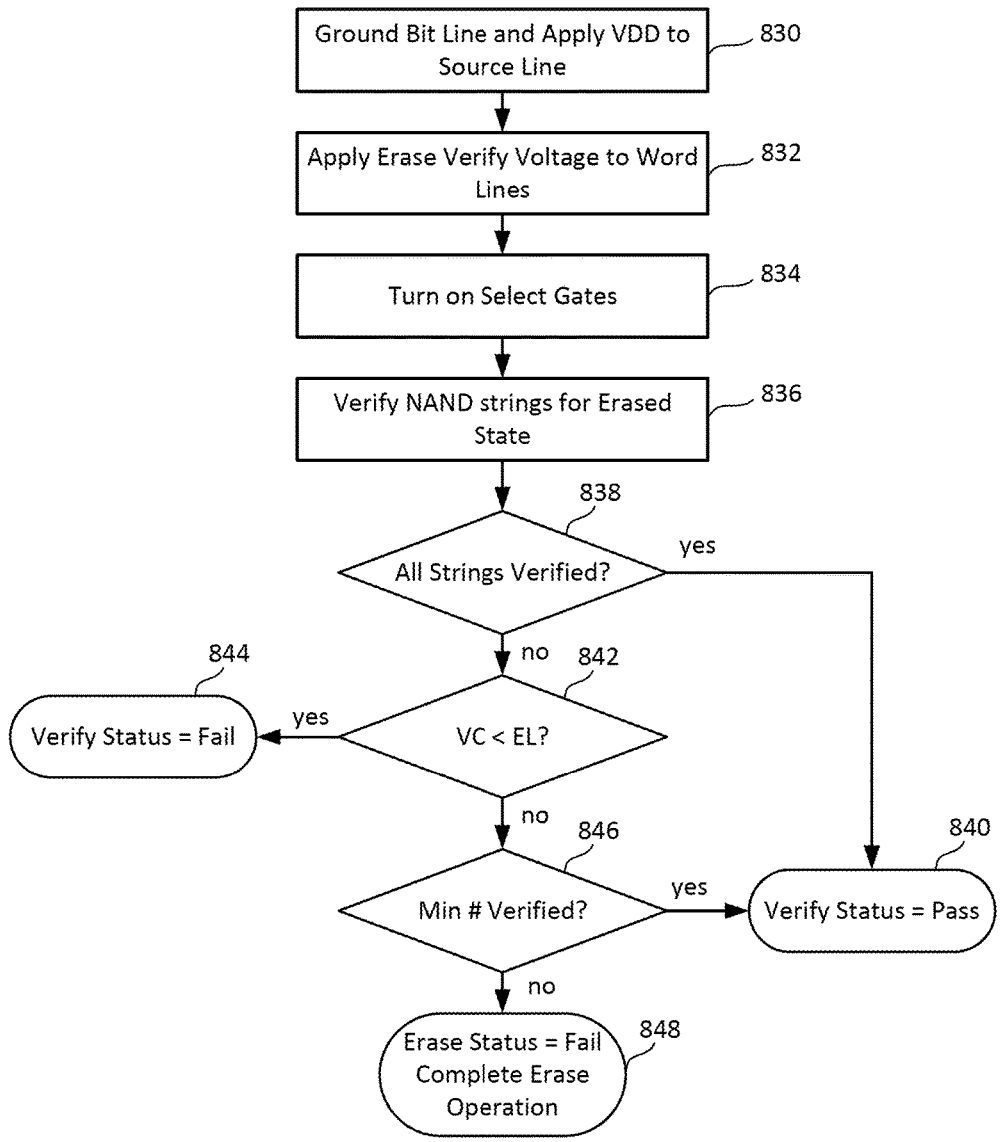
FIG. 10 is a flow chart describing one embodiment of a process for erase verification.
Figure 11:
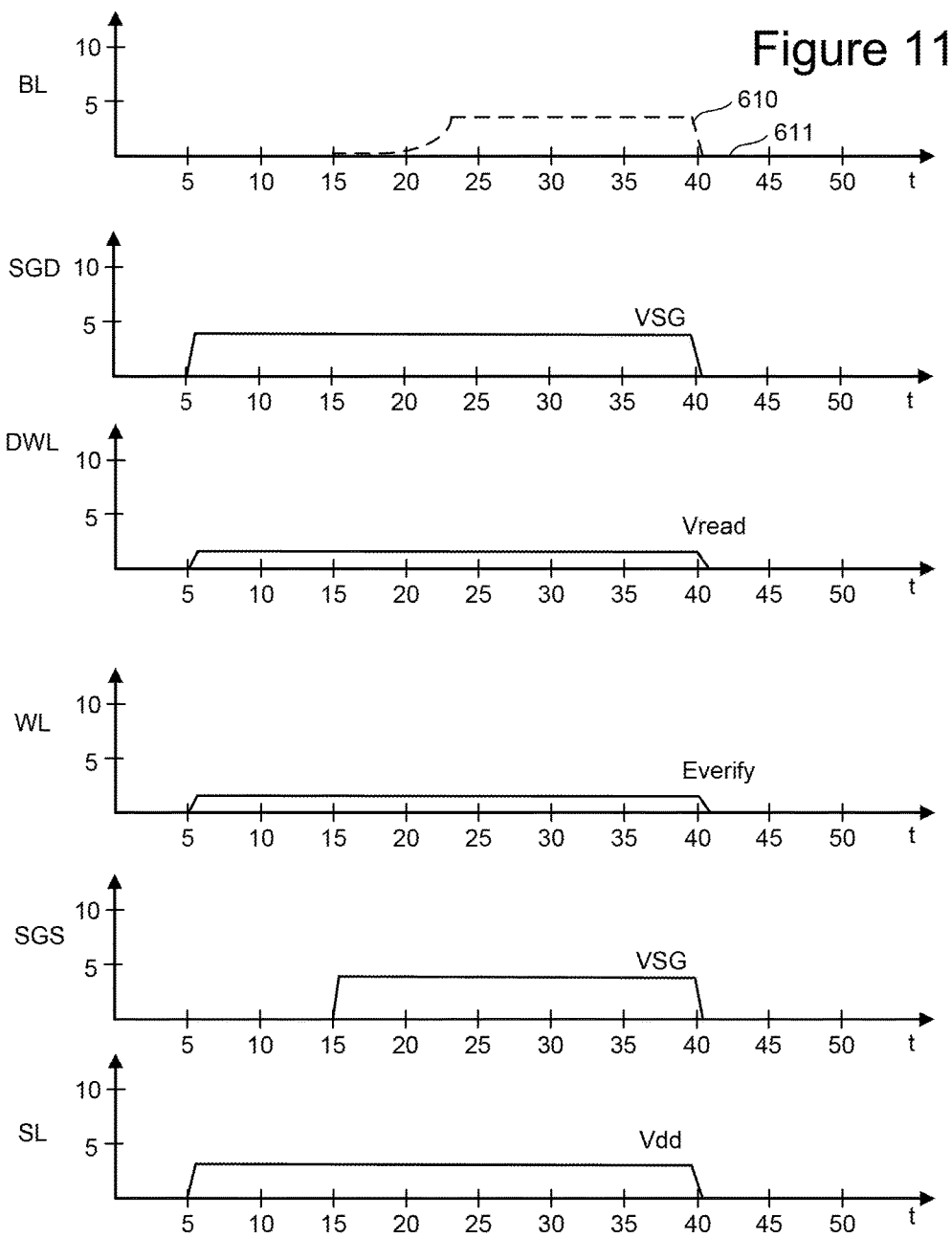
FIG. 11 is a signal diagram depicting the behavior of various signals during an erase verification operation.

FIG. 10 is a flowchart describing one embodiment of an erase verification operation. The process of FIG. 10 is one example implementation of step 804 of FIG. 8. The process in FIG. 10 can be performed by any one of the one or more control circuits described above with respect to FIGS. 2 and 3 in conjunction with the three-dimensional memory structure of FIGS. 4-4F. FIG. 11 is a timing diagram describing various signals for an erase verification in one embodiment. The steps of FIG. 10 may be performed by control circuitry 110 in one embodiment.

With reference to FIGS. 10 and 11, the bit line is grounded and a voltage VDD is applied to the source line at step 830. At step 832 the erase verify voltage Everify (e.g., 0.4-0.7V) is applied to the word lines of the block and at step 834 the select gates are turned on by application of a voltage such as VSG (e.g., 4.0-4.5V). A verify pass voltage Vread is applied to the dummy word lines DWL.

The bit line voltage is allowed to develop based on the erase level of the string of memory cells. At step 836, each NAND string is verified for the erased state based on the erase verify voltage applied at step 832. If the memory cells of a NAND string are sufficiently erased with a threshold voltage below the Everify level, they will be in the on state and provide a conduction path from the source line to the bit line. A current will be induced through the NAND string and the bit line voltage will increase. After a predetermined amount of time, the bit line voltage is sensed or checked by a sense amplifier. If the bit line voltage has reached a predetermined level, the NAND string is verified as erased. As shown in FIG. 11, the bit line voltage will rise as shown by line 610 if the memory cells are sufficiently erased but will remain at 0V as shown by line 611 if the memory cells are not sufficiently erased.

At step 838, the control circuit determines whether all of the NAND strings were successfully verified at step 836 for the erased state based on the erase verify voltage Everify. If all of the NAND strings are successfully verified as erased, the erase verification process is determined to have been successful. A verify status of pass can be passed to the controller or host device at step 840. The erase verify pass status is used at step 806 to determine to continue to step 808.

If all of the NAND strings are not successfully verified at step 838, the erase verification process continues at step 842 where a verify counter VC is checked against a threshold such as an erase limit EL. The verify counter can be initialized to zero when beginning the erase process. The counter is used to limit the number of iterations or cycles of step 804 for the erase process. One example of an erase limit EL is 8, however, other values above and below 8 can be used. If the verify counter VC is less than the erase limit EL, the erase verification process is determined to have failed at step 844. The erase verify fail status is used at step 806 of FIG. 8 to determine to continue to step 818.

If the verify counter is not below the erase limit EL, the process continues at step 846. The control circuit determines if a minimum number of NAND strings of the block have been successfully verified. If a minimum number of NAND strings have been verified, the erase verification operation is determined to have passed at step 840. The erase verify status of pass can be passed to a controller or host device. The erase process is determined to have been successful despite the presence of strings that are not adequately erased. Techniques including error correction control or mapping out of non-erased strings can be used to accommodate these strings. If the number of non-verified strings is not less than or equal to the predetermined number, a status of fail is reported for the erase operation at step 848.

Figure 12:
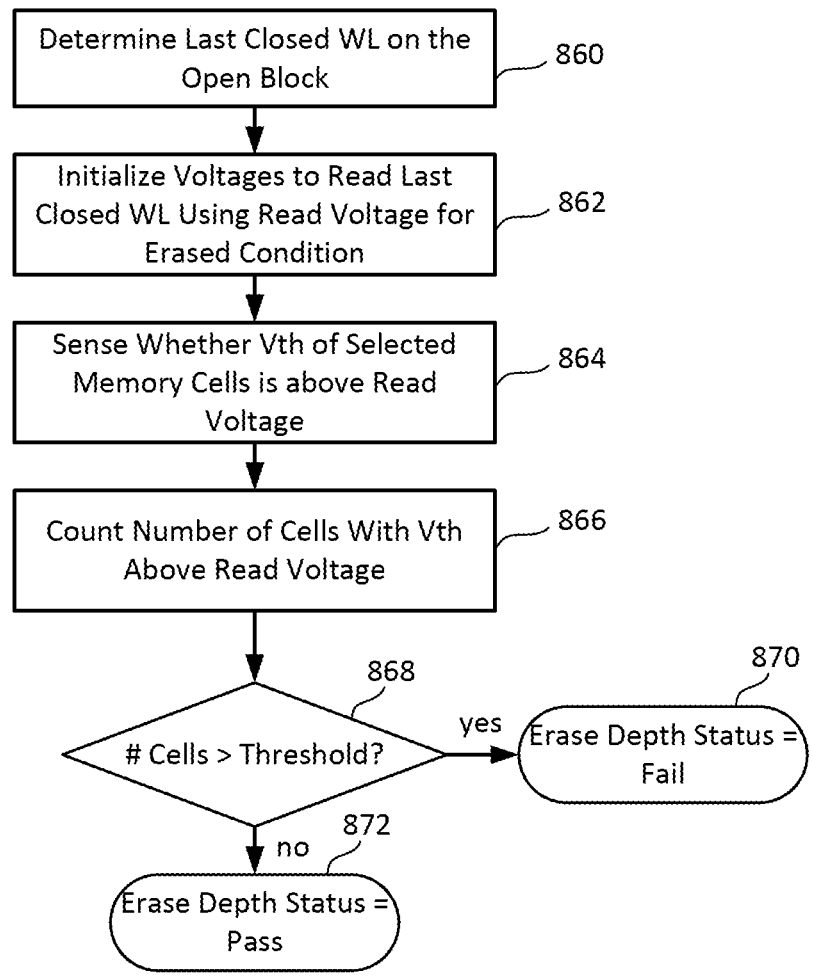
FIG. 12 is a flow chart describing one embodiment of a process for an erase depth check operation.
Figure 13:
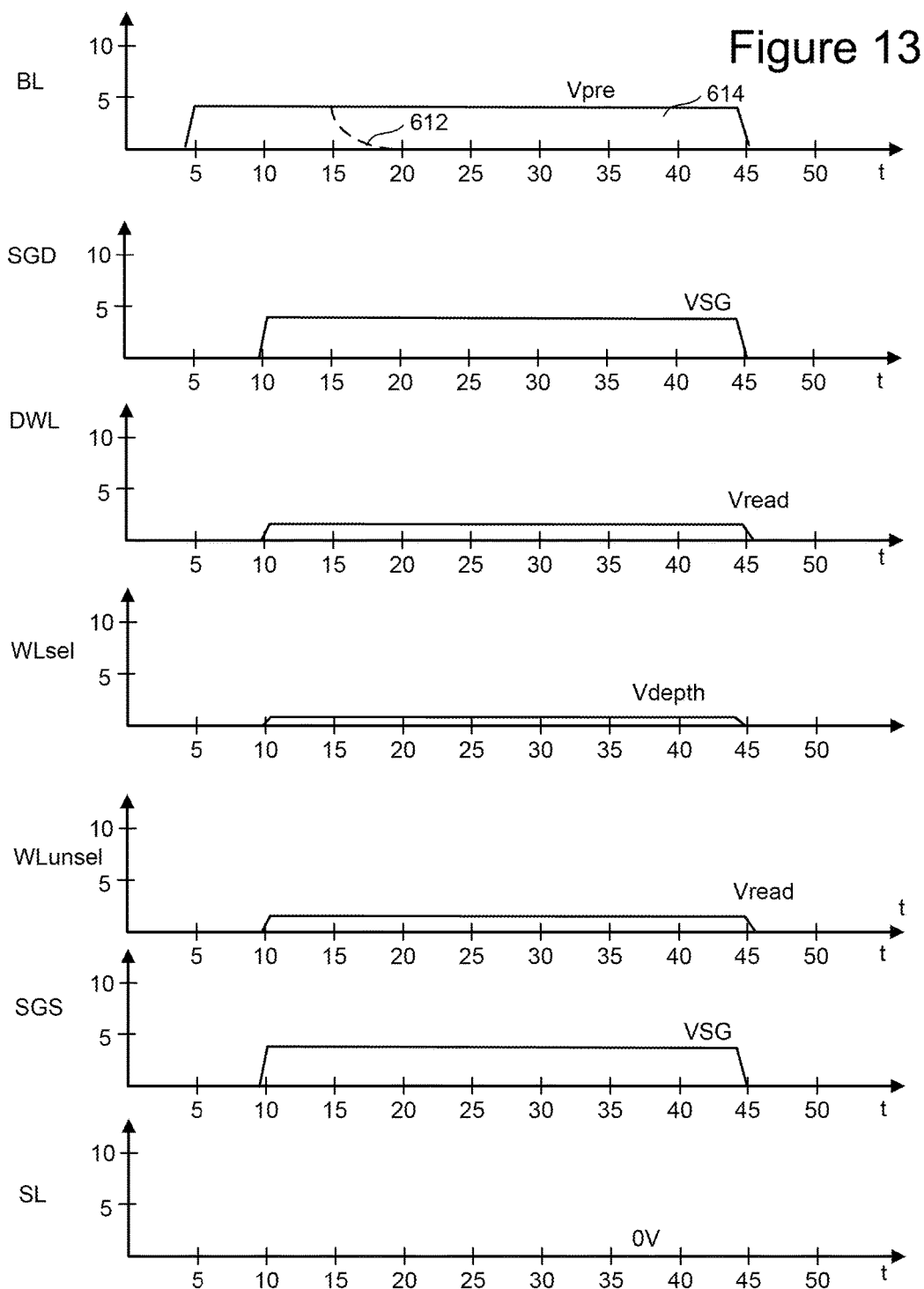
FIG. 13 is a signal diagram depicting the behavior of various signals during an erase depth check operation.

FIG. 12 is a flowchart describing one embodiment of an erase depth check operation. The process of FIG. 12 is one example implementation of step 810 of FIG. 8. The process in FIG. 12 can be performed by any one of the one or more control circuits (a control circuit may be used to refer to one or more control circuits) described above with respect to FIGS. 2 and 3 in conjunction with the three-dimensional memory structure of FIGS. 4-4F. FIG. 13 is a timing diagram describing various signals for an erase depth check in one embodiment.

At step 860, the control circuit determines the last closed word line WL of the open block. The last closed word line refers to the last word line to be programmed for the block. The last closed word line may be any word line in a partially programmed block except for the final word line adjacent to the select gates or dummy word lines. Step 860 can be performed off the memory die by controller 122 or on the memory die by control circuitry 110. In one example, step 860 of FIG. 12 is performed by controller 122 and steps 862-877 are performed by control circuitry 110.

At step 862, the control circuit initializes voltages to read the last closed WL using a read reference voltage for an erased condition. With reference to FIG. 13, the control circuit precharges the bit lines to a pre-charge voltage Vpre (e.g., 0.7V) at time t5. The signals on the drain side select lines SGD are raised to VSG and the signals on the source side select lines SGS are raised to VSG, coupling the NAND string to both the source and bit lines. The signals on the dummy word lines DWL are raised to a pass voltage Vread. The signals on all the unselected word lines WLunsel are also raised to Vread. Vread is a pass voltage that is large enough to ensure that the memory cells of the unselected word lines are conductive during the erase depth check. In one embodiment, Vread is larger than the highest voltage of any programmed memory cell (e.g., 6.0V). However, Vread may be a relatively low voltage (e.g., 1.0V) because the memory cells have already been erased and verified as in an erased state such that a low pass voltage should guarantee conduction. The signal for the source line SL is set to 0V. The signal for the selected word line WLsel is set to the read reference voltage Vdepth for the erase depth check.

The read reference voltage Vdepth is selected to determine an erase level or to check an erase depth of the already erased memory cells. In one embodiment, the read reference voltage is lower than the erase verify voltage. In another embodiment, the read reference voltage may be equal to the erase verify voltage. A read reference voltage that is lower than the erase verify voltage may be useful to amplify the shallow erase bit count. In one example, an erase verify voltage of about 0.4V-0.7V may be used to verify for an erased state, while a read reference voltage Vdepth of about 0V may be used to read for an erased condition.

At step 864, the control circuit senses whether the threshold voltages of the selected memory cells are above the read reference voltage for the erased condition. After biasing the memory for reading, the system may sense a current through each selected NAND string for a sense time.

In general, during the read operation the selected word line or other control line is connected to a voltage (e.g., read reference voltage Vdepth) in order to determine whether a threshold voltage of the concerned storage element has reached such level. As shown in FIG. 13, the bit line will discharge through the NAND string at time t15 as shown by the dashed line 612 in FIG. 13. The discharge results in a cell or conduction current if the memory cell of the selected memory cell turns on under application of Vdepth. If the memory cell does not turn on, the bit line voltage will not discharge as shown by the solid line 614 in FIG. 13. After applying the word line voltage, the conduction current of the storage element is measured to determine whether the storage element turned on. If the conduction current is measured to be greater than a certain value, then it is assumed that the storage element turned on and the voltage applied to the word line is greater than the threshold voltage of the storage element. If the conduction current is not measured to be greater than the certain value, then it is assumed that the storage element did not turn on and the voltage applied to the word line is not greater than the threshold voltage of the storage element.

There are many ways to measure the conduction current of a storage element during a read or verify operation. In one example, the conduction current of a storage element is measured by the rate it allows (or fails to allow) the NAND string that included the storage element to discharge the bit line. The charge on the bit line is measured after a period of time to see whether it has been discharged or not. In another embodiment, the conduction of the selected storage element allows current to flow or not flow on a bit line, which is measured by whether a capacitor in the sense amplifier is charged due to the flow of current.

At step 866, the control circuit counts the number of cells with a threshold voltage above the read reference voltage for the erased condition. The control circuit may utilize a scan or similar circuit to determine the number of cells or bits indicated by the sense amplifier latches that did not conduct during the sense operation. These cells have threshold voltages that are above the read reference voltage for the erased condition. These memory cells are shallow erased, likely having threshold voltages that are below the erase verify level but that are above the read reference voltage.

At step 868, the control circuit compares the number of memory cells with a threshold number. If the number of memory cells is above the threshold, the control circuit determines that the erase depth check operation failed. The erase depth status of fail can be passed to a controller or host device.

If the number of memory cells is not above the threshold, the erase depth check operation is determined to pass at step 872.

In FIG. 12, the last word line to be programmed for the block is determined and is selected for the erase depth check operation. The last word line to be programmed can be selected and used to represent the erase level of the word lines of the block that were programmed after the previous erase operation. The control circuit may keep a record or indication for each partially programmed block that notes the last word line to be programmed for the block. In other implementations, the control circuit may not store such an indication or otherwise be able to determine the last word line to be programmed. Accordingly, one embodiment includes performing an erase depth check on or more predetermined word lines without determining the last word line to be programmed for the block after the previous erase operation. The predetermined word lines may be selected to approximate an erase level of the word lines that were programmed prior to the current erase. In one specific example, the system may check at three word lines of a memory block including 48 word lines. The system may perform an erase depth check at word lines 10, 20, and 30 for example. Other predetermined word lines may be used in place of or in addition to those. Any number, including fewer or more than three, of predetermined word lines may be used.

Figure 14:
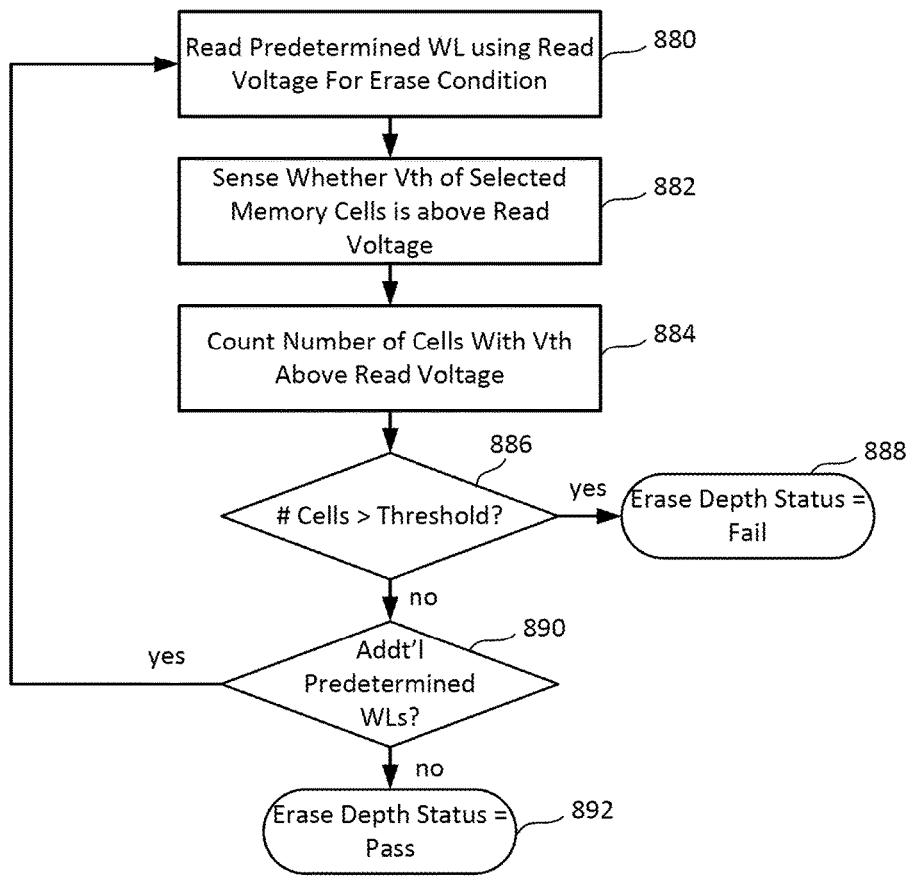
FIG. 14 is a flow chart describing one embodiment of a process for an erase depth check operation.

FIG. 14 is a flowchart describing one embodiment of an alternate erase depth check operation. The process of FIG. 14 is an alternate example implementation of step 810 of FIG. 8. The process in FIG. 14 can be performed by any one of the one or more control circuits described above with respect to FIGS. 2 and 3 in conjunction with the three-dimensional memory structure of FIGS. 4-4F. In FIG. 14, the control circuit performs an erase depth check operation for one or more predetermined word lines of the block, rather than for a last word line known to be programmed. The same signals shown in FIG. 13 may be used with the process in FIG. 14.

At step 880, the control circuit initializes voltages to read a first predetermined word line. For example, the control circuit may initialize voltages to read WL10 or another word line in a block including 48 word lines. The read voltage is selected to determine an erase level or to check an erase depth of the already erased memory cells. In one embodiment, the read reference voltage is lower than the erase verify voltage. In another embodiment, the read reference voltage may be equal to the erase verify voltage. Step 880 may include setting various read pass voltages, select gate voltages, bit line voltages, and source line voltages.

At step 882, the control circuit senses whether the threshold voltages of the selected memory cells are above the read reference voltage for the erased condition. At step 884, the control circuit counts the number of cells with a threshold voltage above the read reference voltage for the erased condition.

At step 886, the control circuit compares the number of memory cells with a threshold number. If the number of memory cells is above the threshold, the control circuit determines that the erase depth check operation failed. The erase depth status of fail can be passed to a controller or host device at step 888.

If the number of memory cells is not above the threshold, the control circuit determines whether there are additional predetermined word lines to undergo the erase depth check operation at step 890. If there are additional word lines to check, the process returns to step 880. If there are not additional word lines to check, the erase depth check operation passes at step 892.

As shown in FIG. 14, the erase depth check may be performed independently on a number of predetermined word lines. In this manner, the system may determine whether any of the predetermined word lines are indicative of a shallow erased condition. Without knowing the last word line to be programmed, the system may nevertheless determine whether any one of the word lines of the block are indicative of a word line that was programmed prior to the current erase operation and that is currently in a shallow erase condition.

As shown in FIG. 7C, once a word line is programmed in a partially programmed block, it will experience a large fail bit count if the block is erased and programmed before a number of additional word lines are programmed for the block. For example, for a given word line WL20, its fail bit count will be high if the block is partially programmed with word lines starting from 0 and increasing sequentially to word lines 20 or 30 before being erased and re-programmed. Once the number of programmed word lines is close to the total number of word lines in the block, the fail bit count decreases again. The lower word lines begin to behave like those of a fully programmed block once a number of programmed word lines is close to the total number of word lines in the block.

Accordingly, the process in FIG. 14 allows individual word lines to be checked against a threshold to determine if any one of the predetermined word lines are indicative of shallow erasing. If any of the word lines have a larger number of bits that are above the read reference voltage for the erased condition, they can be determined to be shallow erased. Thus, if any one of the word lines indicates a shallow-erased condition, the erase depth check fails at step 888 and an additional erase voltage pulse is applied to the block as previously described.

In an alternate to the implementation of FIG. 4, one embodiment includes performing an erase depth check on multiple word lines at once. For example, the system may count the total number of memory cells from multiple word lines that have a threshold voltage above the read reference voltage and compare the total number to a threshold to determine whether the erase depth check operation passes at step 886.

As earlier described, the thresholds for determining whether a subset of memory cells at a predetermined or last word line to be programmed pass an erase depth check can be the same for each word line, or can vary by word line. FIGS. 15A-16E describe a process for selecting a threshold for a particular word line based on a correlation between the fail bit count for the word line during an erase depth check, and the fail bit count for the word line after full programming.

FIGS. 15A-15E are graphs depicting the fail bit count for selected word lines of a block of memory cells. FIGS. 15A-15E show the results for a block of memory cells that is fully programmed, prior to an erase operation which is followed by a full random programming of the block and a subsequent read. In FIGS. 15A-15E, the fail bit count from reading is depicted along the y-axis after the random full programming of the block following a previous erase operation. This fail bit count is labeled PROG FBC. The fail bit count during a word line erase depth check operation for the particular word line of the graph is depicted along the x-axis and is labeled erase FBC.

FIG. 15A depicts the program FBC for word line WL1, illustrating that the prog FBC and the erase FBC are very low. For word line WL10 in FIG. 15B, the peak prog FBC remains about the same, while the erase FBC shows a slight increase. For word line WL20 in FIG. 15C, the prog FBC shows a further increase in prog FBC and a slightly wider range of erase FBC's. For word line WL30 in FIG. 15D, the peak prog FBC is lower but is present across a larger range of erase FBC's. Finally, for word line WL40 the prog FBC remains low, but again is present across a larger range of erase FBC's.

FIGS. 15A-15E demonstrate that for a previously fully programmed block, the FBC after erasing, programming, and reading again is relative low for all word lines and does not show a correlation to the FBC from an erase depth check operation performed for a word line.

FIGS. 16A-16E are graphs depicting the fail bit count for selected word lines of a block of memory cells. FIGS. 16A-16E show the results for a block of memory cells that is partially programmed to the particular word line that is depicted. The partially programmed block is erased, subjected to full random programming of the block and a subsequent read. A higher count along the x-axis for the erase FBC indicates a shallow erase on that specific WL due to an open block condition.

For word line WL1, the prog FBC and the erase FBC both remain low. For word line WL10 in FIG. 16B, the prog FBC is low for low FBC's, then jumps when the erase FBC reaches a first level corresponding to the arrow. When the erase FBC reaches the first level, the prog FBC jumps and remains at the increased level across a wide range erase FBC's up to the maximum level. Thus, the threshold for checking whether the erase depth of word line WL10 is shallow can be set to the first level. By checking whether the number of bits on WL10 that are above the read reference voltage Vdepth is less than the first level, the system can determine whether the block should be subjected to additional erasing or should be passed for erase. If the number of bits that fail the erase depth check is above the first level, it is likely that any subsequent read following a program operation will suffer from an increased programmed FBC.

For word line WL20 in FIG. 16C, the prog FBC exhibits similar behavior. For word line WL10, the prog FBC jumps from a relatively low level to a relatively high level when the erase FBC reaches a second level that is slightly higher than the level in FIG. 16B Thus, the threshold for checking whether the erase depth of word line WL20 is shallow can be set to the second level. By checking whether the number of bits on WL10 that are above the read reference voltage Vdepth is less than the second level, the system can determine whether the block should be subjected to additional erasing or should be passed for erase.

The data in FIGS. 16A-16E illustrate that for lower WLs, when the erase FBC is high (x-axis), the FBC after random programming (y-axis) is also high. Accordingly, the erase FBC may be used for the lower WLs to indicate shallow erase of open block and the need to apply additional erasing.

In one embodiment, the control circuit performs full block erasing as described in FIG. 9 following an erase depth check fail. In another embodiment, the control circuit can perform partial block erasing following an erase depth check fail. For example, the control circuit may erase the previously programmed word lines of the partially programmed block while inhibiting the erased word lines from being erased. With reference to FIG. 9 for example, the programmed word lines may receive an erase enable voltage Vlow which promotes erase of the word lines during the erase voltage pulse Verase. The erased word lines (those not subjected to programming following the previous erase operation), however, can receive an erase inhibit voltage. For example, the erased word lines may receive a voltage at or near the voltage level of Vera. The inhibit voltage raises the word line voltage to near that of the bit lines so that erase is inhibited for these word lines by decreasing or eliminating any voltage difference across the charge trap layers.

In one embodiment, the control circuit dynamically determines whether to subject the block to full block erasing or partial block erasing. For example, the control circuit may determine whether the open block was subjected to read disturb prior to the erase operation. The controller can determine whether the open block was read following the partial programming. If the partially programmed block was subjected to read disturb, the control circuit may perform a partial block erase at step 816 of FIG. 8 for example. Only the programmed word lines are subjected to erase while the erased word lines are inhibited from programming during the erase voltage pulse. If the partially programmed block was not subjected to read disturb, the control circuit may perform a full block erase at step 816 of FIG. 8 for example.

In another embodiment, the control circuit may determine whether the block was subjected to partial block erasing earlier, for example during a previous erase iteration. If so the control circuit may continue with partial block erasing. If the block was not subjected to partial block erasing earlier, the control circuit may continue with full block erasing. Various options may be used to determine whether to perform a full or partial block erase.

Accordingly, an apparatus has been described that includes a control circuit configured to erase a plurality of memory cells coupled to a plurality of word lines as part of an erase operation. The control circuit is configured to determine an erase level of a subset of the non-volatile memory cells in response to successful verification of the plurality of non-volatile memory cells for an erased state. The control circuit is configured to erase at least a portion of the plurality of non-volatile memory cells if the erase level of the subset is above a threshold. The subset includes fewer than the plurality of non-volatile memory cells.

An apparatus has been described that includes a plurality of word lines coupled to a plurality of non-volatile memory cells, and an erase circuit coupled to the plurality of word lines. The erase circuit responds to the plurality of memory cells passing erase verification for an erase operation by reading from one or more of the word lines using a read reference voltage that is lower than an erase verify voltage. The erase circuit determines a number of bits of the one or more word lines having a threshold voltage above the read reference voltage and applies an erase voltage pulse to the plurality of non-volatile memory cells based on the number of bits exceeding a threshold.

A method has been described that includes applying one or more erase voltage pulses to a plurality of non-volatile memory cells. After verifying that the plurality of non-volatile memory cells is erased based on a first reference voltage, the method includes reading a subset of non-volatile memory cells for an erased condition based on a second reference voltage. The second reference voltage is lower than the first reference voltage. The method includes applying one or more additional erase voltage pulses to at least a portion of the plurality of non-volatile memory cells if the subset of non-volatile memory cells fails to verify for the erased condition based on the second reference voltage.

An apparatus has been described that includes a plurality of word lines coupled to a plurality of non-volatile memory cells and means for determining an erase level of a subset of non-volatile memory cells of the plurality after successfully verifying the plurality of non-volatile memory cells for an erased state. The subset of non-volatile memory cells includes fewer than the group of non-volatile memory cells. The apparatus includes means for erasing at least a portion of the plurality of non-volatile memory cells if the erase level of the subset of non-volatile memory cells is above a threshold.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. An apparatus, comprising:
a control circuit having a memory interface for a non-volatile memory array, the control circuit configured to erase a plurality of non-volatile memory cells coupled to a plurality of word lines of the non-volatile memory array as part of an erase operation, the control circuit configured to perform a read operation to determine an erase depth of a subset of the non-volatile memory cells in response to successful verification of the plurality of non-volatile memory cells for an erased state, the control circuit configured to erase at least a portion of the plurality of non-volatile memory cells if the erase depth of the subset is above a threshold, the subset includes fewer than the plurality of non-volatile memory cells.

2. The apparatus of claim 1, wherein:
the control circuit is configured to verify the plurality of memory cells for the erased state by applying a first reference voltage to the plurality of word lines; and
the control circuit is configured to determine the erase depth of the subset of memory cells by applying a second reference voltage to a subset of word lines coupled to the subset of memory cells, the second reference voltage is lower than the first voltage.

3. The apparatus of claim 2, wherein:
the control circuit is configured to determine whether the erase depth of the subset of non-volatile memory cells is above the threshold by determining a number of non-volatile memory cells of the subset having a threshold voltage above the second reference voltage and determining whether the number is above the threshold.

4. The apparatus of claim 3, wherein:
the threshold is a first threshold;
the plurality of memory cells includes a plurality of NAND strings; and
the control circuit is configured to verify the plurality of memory cells for the erased state by comparing a number of NAND strings that pass erase verification with a second threshold.

5. The apparatus of claim 4, wherein:
the control circuit is configured to erase the at least a portion of the plurality by determining a level of a final erase voltage pulse prior to verification of the plurality for the erased state and applying an additional erase voltage pulse at a level that is higher than the level of the final erase voltage pulse.

6. The apparatus of claim 1, wherein:
the plurality of non-volatile memory cells is a block comprising non-volatile memory cells and the erase operation is a first erase operation;
the control circuit is configured to determine the erase depth of the subset based on the block being partially programmed prior to the first erase operation and to complete the first erase operation when the erase depth of the subset of memory cells is above the threshold;
the control circuit is configured to erase the block of memory cells when the block is fully programmed prior to a second erase operation; and
the control circuit is configured to complete the second erase operation based on successful verification of the plurality for the erased state without determining the erase depth of the subset of memory cells.

7. The apparatus of claim 1, wherein:
the control circuit is configured to determine a last word line of the plurality to be programmed prior to the erase operation; and
the subset of non-volatile memory cells includes non-volatile memory cells coupled to the last word line to be programmed.

8. The apparatus of claim 1, wherein:
the subset of non-volatile memory cells includes memory cells coupled to one or more predetermined word lines of the plurality:
the control circuit is configured to determine the erase depth of the subset of non-volatile memory cells by comparing a number of non-volatile memory cells of a first predetermined word line that are above the erase depth with a first threshold number;
if the number of non-volatile memory cells of the first predetermined word line is above the first threshold number, the control circuit is configured to erase the at least a portion of the plurality of non-volatile memory cells;
if the number of non-volatile memory cells of the first predetermined word line is below the first threshold number, the control circuit is configured to compare a number of non-volatile memory cells of a second predetermined word line that are above the erase depth with a second threshold number;
if the number of non-volatile memory cells of the second predetermined word line is above the second threshold number, the control circuit is configured to erase the at least a portion of the plurality; and
if the number of non-volatile memory cells of the second predetermined word line is below the second threshold number, the control circuit is configured to complete the erase operation.

9. The apparatus of claim 1, wherein:
the control circuit is configured to erase the at least a portion of the plurality of non-volatile memory cells by applying an erase voltage pulse through a substrate or a source line while applying an erase enable voltage to the plurality of word lines.

10. The apparatus of claim 1, wherein:
the control circuit is configured to erase the at least a portion of the plurality by applying an erase voltage pulse to a plurality of bit lines while applying an erase enable voltage to a first group of the plurality of word lines and applying an erase inhibit voltage to a second group of the plurality of word lines.

11. The apparatus of claim 10, wherein:
the first group of the plurality of word lines includes word lines that have been subjected to programming since a previous erase operation; and
the second group of the plurality of word lines includes word lines that have not been subjected to programming since the previous erase operation.

12. A method, comprising:
applying one or more erase voltage pulses to a plurality of non-volatile memory cells;
after verifying that the plurality of non-volatile memory cells are erased based on a first reference voltage and prior to applying an additional erase voltage pulse, reading a subset of non-volatile memory cells for an erased condition based on a second reference voltage, the second reference voltage is lower than the first reference voltage, and the subset includes fewer than the plurality of non-volatile memory cells; and applying one or more additional erase voltage pulses to at least a portion of the plurality of non-volatile memory cells if the subset of non-volatile memory cells fails to verify for the erased condition based on the second reference voltage.

13. The method of claim 12, wherein the plurality of non-volatile memory cells is coupled to a plurality of a word lines of a block, the method further comprising:
determining a last word line of the plurality to be programmed prior to reading the subset of non-volatile memory cells; and
wherein the subset of non-volatile memory cells is coupled to the last word line.

14. The method of claim 12, wherein the plurality of non-volatile memory cells is a block of non-volatile memory cells and the one or more erase voltage pulses are applied as part of a first erase operation, the method further comprising:
determining that the block of non-volatile memory cells is partially programmed prior to reading the subset of non-volatile memory cells for the erased condition;
completing the first erase operation based on the subset of non-volatile memory cells verifying for the erase condition based on the second reference voltage;
determining that the block of non-volatile memory cells is fully programmed for a second erase operation; and
completing the second erase operation based on the plurality of non-volatile memory cells verifying for an erased state without reading for the erased condition.

15. An apparatus, comprising:
a plurality of word lines coupled to a plurality of non-volatile memory cells;
means for determining an erase depth of a subset of non-volatile memory cells of the plurality after successfully verifying the plurality of non-volatile memory cells for an erased state, the subset of non-volatile memory cells includes fewer than the plurality of non-volatile memory cells; and
means for erasing at least a portion of the plurality of non-volatile memory cells if the erase depth of the subset of non-volatile memory cells is above a threshold.

16. The apparatus of claim 15, wherein:
the means for determining includes means for verifying the plurality of non-volatile memory cells for the erased state using a first reference voltage; and
the means for determining determines the erase depth of the subset of non-volatile memory cells using a second reference voltage, the second reference voltage is lower than the first reference voltage.

17. The apparatus of claim 16, wherein the plurality of non-volatile memory cells comprise a block of memory cells and the means for determining determines the erase depth as part of a first erase operation, the apparatus further comprising:
means for completing the first erase operation based on the erase depth of the subset of non-volatile memory cells being below the threshold;
means for determining whether the block is partially programmed prior to a second erase operation; and
means for completing the second erase operation based on successfully verifying the block for the erased state using the first reference voltage.

* * * * *